United States Patent
Yang et al.

(10) Patent No.: US 12,412,857 B2
(45) Date of Patent: *Sep. 9, 2025

(54) HYBRID MICRO-BUMP INTEGRATION WITH REDISTRIBUTION LAYER

(71) Applicant: Taiwan Semiconductor Manufacturing Co., Ltd., Hsinchu (TW)

(72) Inventors: Ting-Li Yang, Tainan (TW); Po-Hao Tsai, Zhongli (TW); Yi-Wen Wu, Xizhi (TW); Sheng-Pin Yang, Kaohsiung (TW); Hao-Chun Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/360,425

(22) Filed: Jul. 27, 2023

(65) Prior Publication Data

US 2023/0369269 A1  Nov. 16, 2023

Related U.S. Application Data

(62) Division of application No. 17/326,941, filed on May 21, 2021, now Pat. No. 11,855,028.

(Continued)

(51) Int. Cl.
*H01L 23/00* (2006.01)
*H01L 21/48* (2006.01)
(Continued)

(52) U.S. Cl.
CPC .......... *H01L 24/14* (2013.01); *H01L 21/4853* (2013.01); *H01L 23/49811* (2013.01);
(Continued)

(58) Field of Classification Search
CPC ........ H01L 24/14; H01L 24/10; H01L 24/17; H01L 28/60; H01L 24/742; H10D 1/692
See application file for complete search history.

(56) References Cited

U.S. PATENT DOCUMENTS

| 7,329,597 B2 | 2/2008 | Chung et al. |
| 8,704,371 B2 * | 4/2014 | Abdul Razak .......... H01L 24/06 257/737 |

(Continued)

FOREIGN PATENT DOCUMENTS

| JP | 2009111196 A | 5/2009 |
| JP | 2012256737 A | 12/2012 |

(Continued)

*Primary Examiner* — Phat X Cao
(74) *Attorney, Agent, or Firm* — Slater Matsil, LLP

(57) ABSTRACT

A semiconductor device includes a substrate; an interconnect structure over the substrate; a first passivation layer over the interconnect structure; a first conductive pad, a second conductive pad, and a conductive line disposed over the first passivation layer and electrically coupled to conductive features of the interconnect structure; a conformal second passivation layer over and extending along upper surfaces and sidewalls of the first conductive pad, the second conductive pad, and the conductive line; a first conductive bump and a second conductive bump over the first conductive pad and the second conductive pad, respectively, where the first conductive bump and the second conductive bump extend through the conformal second passivation layer and are electrically coupled to the first conductive pad and the second conductive pad, respectively; and a dummy bump over the conductive line, where the dummy bump is separated from the conductive line by the conformal second passivation layer.

20 Claims, 21 Drawing Sheets

Related U.S. Application Data

(60) Provisional application No. 63/139,928, filed on Jan. 21, 2021.

(51) Int. Cl.
    *H01L 23/498*     (2006.01)
    *H01L 23/522*     (2006.01)
    *H10D 1/68*     (2025.01)

(52) U.S. Cl.
    CPC .......... *H01L 23/5226* (2013.01); *H01L 24/10* (2013.01); *H01L 24/17* (2013.01); *H10D 1/692* (2025.01)

(56) References Cited

U.S. PATENT DOCUMENTS

| | | |
|---|---|---|
| 9,548,290 B2 | 1/2017 | Wakiyama et al. |
| 9,711,477 B2 | 7/2017 | Wu et al. |
| 11,855,028 B2 * | 12/2023 | Yang ................... H01L 23/5226 |
| 2005/0104222 A1 | 5/2005 | Jeong et al. |
| 2013/0207259 A1 | 8/2013 | Yutani et al. |
| 2015/0130052 A1 | 5/2015 | Detalle |
| 2015/0170995 A1 | 6/2015 | Chen et al. |
| 2015/0221714 A1 | 8/2015 | Gu et al. |
| 2018/0060479 A1 | 3/2018 | Lo et al. |
| 2018/0151495 A1 | 5/2018 | Hsu et al. |
| 2019/0006306 A1 * | 1/2019 | Shibata ................... H01L 24/14 |
| 2019/0229079 A1 | 7/2019 | Pozder et al. |
| 2020/0273806 A1 | 8/2020 | Chiang et al. |

FOREIGN PATENT DOCUMENTS

| | | |
|---|---|---|
| KR | 20130020512 A | 2/2013 |
| KR | 101449789 B1 | 10/2014 |

\* cited by examiner

HYBRID MICRO-BUMP INTEGRATION WITH REDISTRIBUTION LAYER

PRIORITY CLAIM AND CROSS-REFERENCE

This application is a divisional of U.S. patent application Ser. No. 17/326,941, filed May 21, 2021 and entitled "Hybrid Micro-Bump Integration with Redistribution Layer," which claims the benefit of the U.S. Provisional Application No. 63/139,928, filed Jan. 21, 2021 and entitled "Advanced Hybrid μ-bump Integrated with Cu RDL," which applications are hereby incorporated herein by reference.

BACKGROUND

High-density integrated circuits, such as Very Large Scale Integration (VLSI) circuits, are typically formed with interconnect structures (also referred to as interconnects) serving as three-dimensional wiring line structures. The purpose of the interconnect structures is to properly connect densely packed devices together to form functional circuits. With increasing levels of integration, a parasitic capacitance effect between the metal lines of the interconnects, which leads to RC delay and cross-talk, increases correspondingly. In order to reduce the parasitic capacitance and increase the conduction speed of the interconnections, low-k dielectric materials are commonly employed to form Inter-Layer Dielectric (ILD) layers and Inter-Metal Dielectric (IMD) layers.

Metal lines and vias are formed in the IMD layers. A formation process may include forming an etch stop layer over first conductive features, and forming a low-k dielectric layer over the etch stop layer. The low-k dielectric layer and the etch stop layer are patterned to form a trench and a via opening. The trench and the via opening are then filled with a conductive material, followed by a planarization process to remove excess conductive material, so that a metal line and a via are formed. Conductive bumps, such as micro-bumps (μ-bumps) and controlled collapse chip connection bumps (C4 bumps), are formed over the interconnect structures for connection with other devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
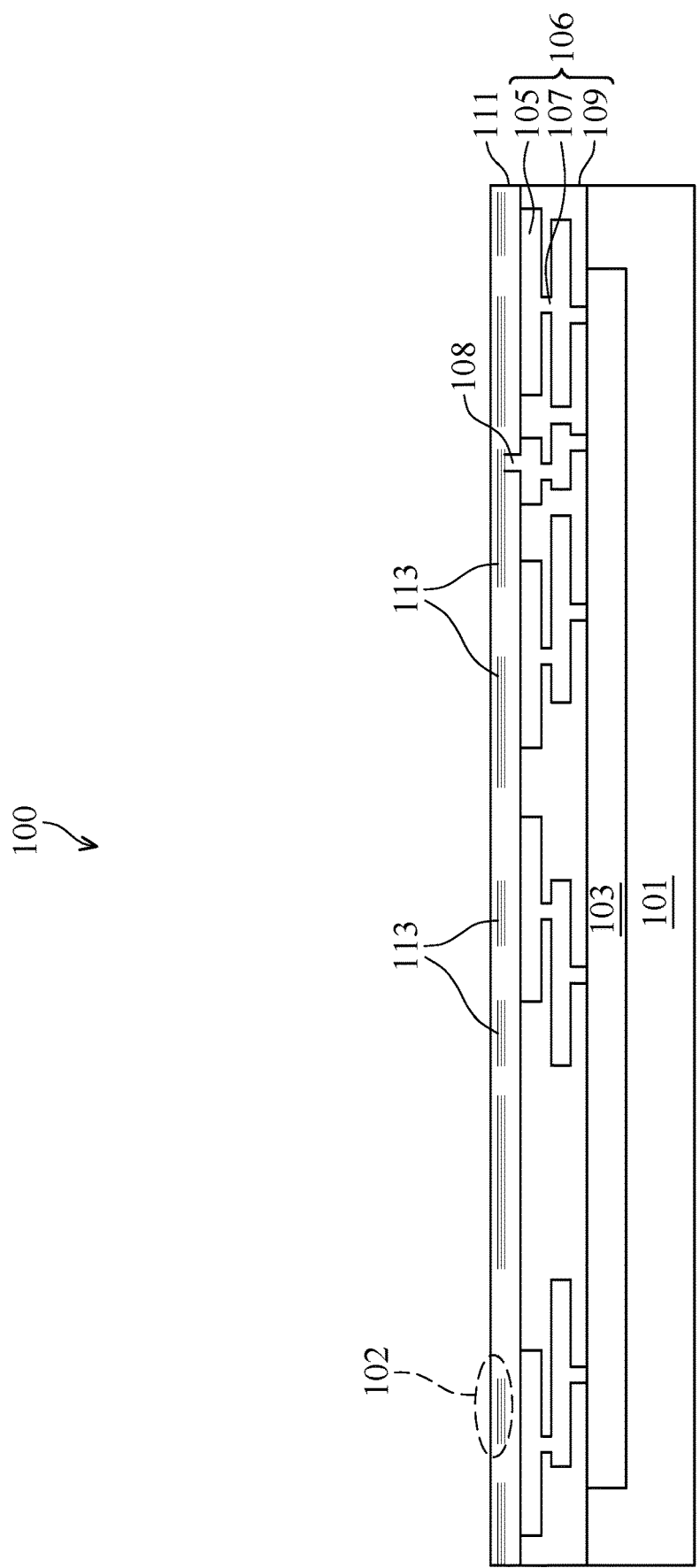
FIGS. 1A, 1B, 2-7, and 8A-8D illustrate cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s). In addition, unless otherwise specified, figures with the same numeral and different alphabets (e.g., FIG. 8A and FIG. 8B) illustrate different views (e.g., along different cross-sections) of the same semiconductor device at the same stage of manufacturing.

In accordance with an embodiment, a plurality of conductive pads and conductive lines are formed over and electrically coupled to an interconnect structure. A conformal passivation layer is formed over the conductive pads and the conductive lines. Conductive bumps, such as micro-bumps (μ-bumps) and controlled collapse chip connection bumps (C4 bumps), are formed over the passivation layer and electrically coupled to the underlying conductive pads. Dummy bumps are formed over the conductive lines and are isolated from the conductive lines. By forming the dummy bumps over the conductive lines, dummy conductive pads are no longer needed, and the space saved may be used to route other functional features, such as the conductive lines. In some embodiments, a dielectric layer is formed over the passivation layer before the conductive bumps are formed. The dielectric layer fills the gaps between the conductive pads and between the conductive lines, thus making it easier to form the seed layer used for forming the conductive bumps. The present disclosure allows different types of conductive bumps, such as C4 bumps and μ-bumps, to be mixed together (e.g., interposed between each other) in a same region of the semiconductor device. Such a hybrid bump scheme allows for more flexibility in the design of conductive bumps to accommodate different design requirements.

FIGS. 1A, 1B, 2-7, and 8A-8D illustrate cross-sectional views of a semiconductor device 100 at various stages of manufacturing, in accordance with an embodiment. The semiconductor device 100 may be a device wafer including active devices (e.g., transistors, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

As illustrated in FIG. 1A, the semiconductor device 100 includes a semiconductor substrate 101 and electrical components 103 (e.g., active devices, passive devices) formed on or in the semiconductor substrate 101 (may also be referred to as substrate 101). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In the example of FIG. 1A, electrical components 103 are formed on or in the semiconductor substrate 101. Examples of the electrical components 103 include transistors (e.g., Complementary Metal-Oxide Semiconductor (CMOS) transistors), resistors, capacitors, diodes, and the like. The electrical components 103 may be formed using any suitable method, details are not discussed here.

In some embodiments, after the electrical components 103 are formed, an Inter-Layer Dielectric (ILD) layer is formed over the semiconductor substrate 101 and over the electrical components 103. The ILD layer may fill spaces between gate stacks of the transistors (not shown) of the electrical components 103. In accordance with some embodiments, the ILD layer comprises silicon oxide, phosphosilicate glass (PSG), borosilicate glass (BSG), boron-doped phosphosilicate glass (BPSG), fluorine-doped silicate glass (FSG), tetraethyl orthosilicate (TEOS), or the like. The ILD layer may be formed using spin coating, Flowable Chemical Vapor Deposition (FCVD), Plasma Enhanced Chemical Vapor Deposition (PECVD), Low Pressure Chemical Vapor Deposition (LPCVD), or the like.

Contact plugs are formed in the ILD layer, which contact plugs electrically couple the electrical components 103 to conductive features (e.g., metal lines, vias) of subsequently formed interconnect structures 106. Note that in the present disclosure, unless otherwise specified, a conductive feature refers to an electrically conductive feature, and a conductive material refers to an electrically conductive material. In accordance with some embodiments, the contact plugs are formed of a conductive material such as tungsten, aluminum, copper, titanium, tantalum, titanium nitride, tantalum nitride, alloys thereof, and/or multi-layers thereof. The formation of the contact plugs may include forming contact openings in the ILD layer, forming one or more conductive material(s) in the contact openings, and performing a planarization process, such as a Chemical Mechanical Polish (CMP), to level the top surface of the contact plugs with the top surface of the ILD layer.

Still referring to FIG. 1A, interconnect structures 106 are formed over the ILD layer and over the electrical components 103. The interconnect structures 106 comprise a plurality of dielectric layers 109 and conductive features (e.g., metal lines, vias) formed in the dielectric layers log. In some embodiments, the interconnect structures 106 interconnect the electrical components 103 to form functional circuits of the semiconductor device 100.

In some embodiments, each of the dielectric layers log, which may also be referred to as an Inter-Metal Dielectric (IMD) layer, is formed of a dielectric material such as silicon oxide, silicon nitride, silicon carbide, silicon oxynitride, or the like. In accordance with some embodiments, the dielectric layers 109 are formed of a low-k dielectric material having a dielectric constant (k-value) lower than 3.0, such as about 2.5, about 2.0, or even lower. The dielectric layers 109 may comprise Black Diamond (a registered trademark of Applied Materials), a carbon-containing low-k dielectric material, Hydrogen SilsesQuioxane (HSQ), MethylSilsesQuioxane (MSQ), or the like. The formation of each of the dielectric layers 109 may include depositing a porogen-containing dielectric material over the ILD layer, and then performing a curing process to drive out the porogen, thereby forming the dielectric layer 109 that is porous, as an example. Other suitable method may also be used to form the dielectric layers 109.

As illustrated in FIG. 1A, conductive features, such as conductive lines 105 and vias 107, are formed in the dielectric layers 109. In an example embodiment, the conductive features may include a diffusion barrier layer and a conductive material (e.g., copper, or a copper-containing material) over the diffusion barrier layer. The diffusion barrier layer may include titanium, titanium nitride, tantalum, tantalum nitride, or the like, and may be formed by CVD, Physical Vapor Deposition (PVD), Atomic Layer Deposition (ALD), or the like. After the diffusion barrier layer is formed, the conductive material is formed over the diffusion barrier layer. The formation of the conductive features may include a single damascene process, a dual damascene process, or the like.

Next, a plurality of passivation layers 111 are formed over the interconnect structures 106, and a plurality of metal-insulator-metal (MIM) capacitors 113 are formed in the passivation layers 111. The passivation layers 111 may be formed of one or more suitable dielectric materials such as silicon oxide, silicon nitride, low-k dielectrics such as carbon doped oxides, extremely low-k dielectrics such as porous carbon doped silicon dioxide, combinations of these, or the like. Each of the passivation layers 111 may be formed through a process such as chemical vapor deposition (CVD), FCVD, although any suitable process may be utilized.

Figure 1B:
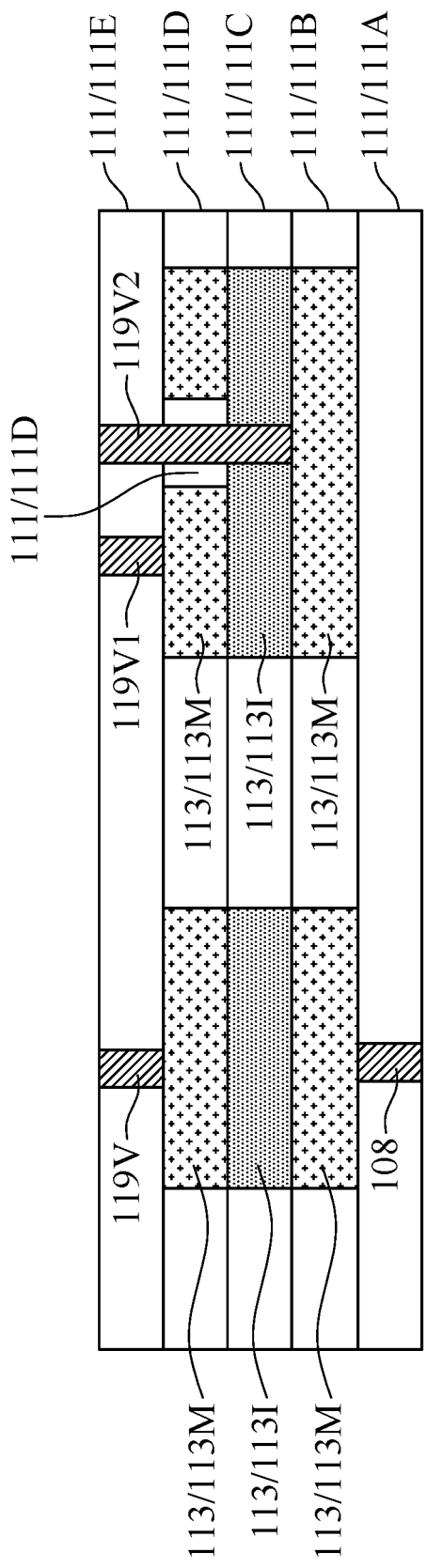

The MIM capacitors 113 are formed in the passivation layers 111. FIG. 1B illustrates a zoomed-in view of an area 102 in FIG. 1A to show details of the MIM capacitors 113. As illustrated in FIG. 1B, each of the MIM capacitors 113 includes two metal layers 113M (e.g., copper layers) and a dielectric layer 113I (e.g., a high-k dielectric layer) between the metal layers 113M. Each of the layers (e.g., 113M, 113I, and 113M) of the MIM capacitor 113 is formed in a respective passivation layer (e.g., 111B, 111C, or 111D). The upper metal layer 113M and the lower metal layer 113M of the MIM capacitor 113 may be connected to an overlying via 119V and an underlying via 108, respectively, where the overlying via 119V and the underlying via 108 are formed in passivation layers 111E and 111A, respectively, as an example. As another example, the upper metal layer 113M and the lower metal layer 113M of the MIM capacitor 113 may be connected to a first overlying via 119V1 and a second overlying via 119V2, respectively. In the example of FIG. 1B, the second overlying via 119V2 extends through the passivation layer 111D and the dielectric layer 113I to connect with the lower metal layer 113M. Note that the second overlying via 119V2 extends through an opening in the upper metal layer 113M of the MIM capacitor, and therefore, is separated from (e.g., not contacting) the upper metal layer 113M of the MIM capacitor by portions of the passivation layer 111D.

Referring back to FIG. 1A, the lower metal layer of the MIM capacitor 113 may be electrically coupled to a conductive feature of the interconnect structure 106, e.g., through a via that extends from the lower metal layer of the MIM capacitor 113 to the conductive feature of the interconnect structure 106. In addition, the plurality of MIM capacitors 113 may be electrically coupled in parallel to provide a large capacitance value. For example, the upper metal layers of the MIM capacitors 113 may be electrically coupled together, and the lower metal layers of the MIM capacitors 113 may be electrically coupled together. In some embodiments, the MIM capacitors 113 are omitted.

Figure 2:
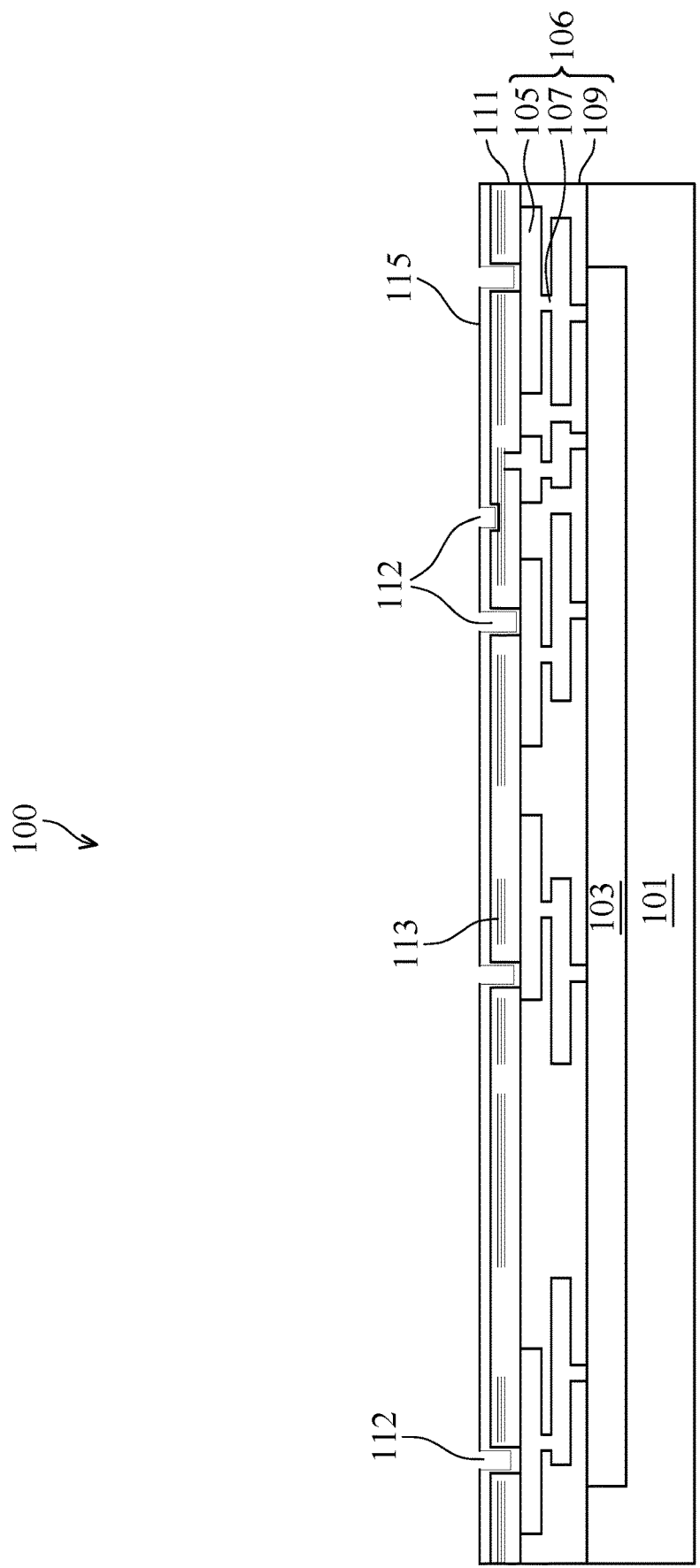

Referring next to FIG. 2, openings 112 are formed in the passivation layer 111. Some of the openings 112 extend through the passivation layer 111 to expose conductive features of the interconnect structure 106. In some embodiments, some of the openings 112 extend partially through the passivation layer 111 to expose the upper metal layers of the MIM capacitors 113. The openings 112 may be formed in one or more etching processes (e.g., anisotropic etching processes).

After the openings 112 are formed, a barrier layer 115 is formed conformally over the upper surfaces of the passivation layer 111 and along sidewalls and bottoms of the openings 112. The barrier layer 115 may have a multi-layer structure and may include a diffusion barrier layer (e.g., a TiN layer) and a seed layer (e.g., a copper seed layer) formed over the diffusion barrier layer. The barrier layer 115 may be formed using any suitable formation method(s), such as CVD, PVD, ALD, combinations thereof, or the like.

Figure 3:
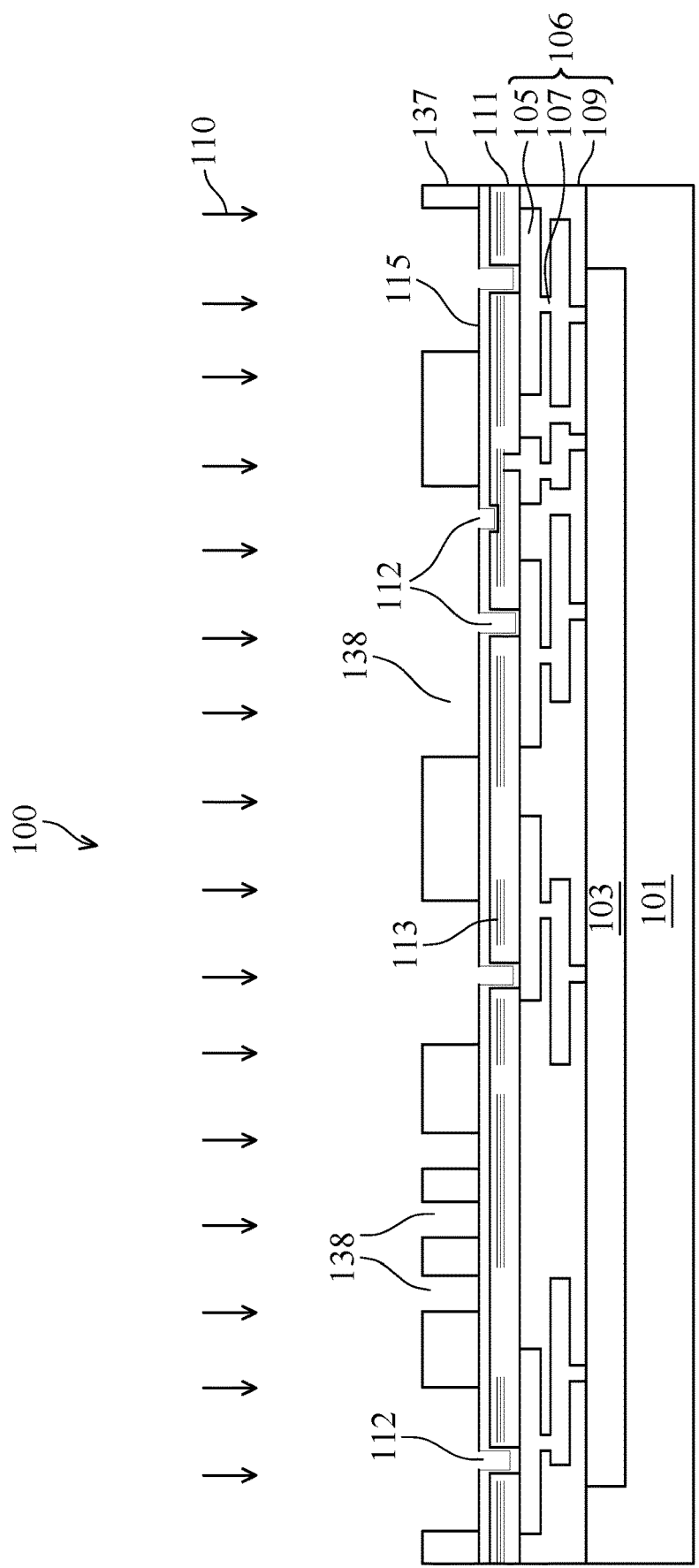

Next, in FIG. 3, a photoresist layer 137 is formed over the barrier layer 115. The photoresist layer 137 is patterned (e.g., using photolithography technique) to form opening 138 at locations where conductive pads 119 and conductive lines 118 (see FIG. 4) will be formed. The openings 138 expose, e.g., the seed layer of the barrier layer 115. After the openings 138 are formed, a descum process 110 is performed to clean residues left by the patterning process of the photoresist layer 137. The descum process 110 may be a plasma process performed using a process gas comprising oxygen, as an example.

Figure 4:
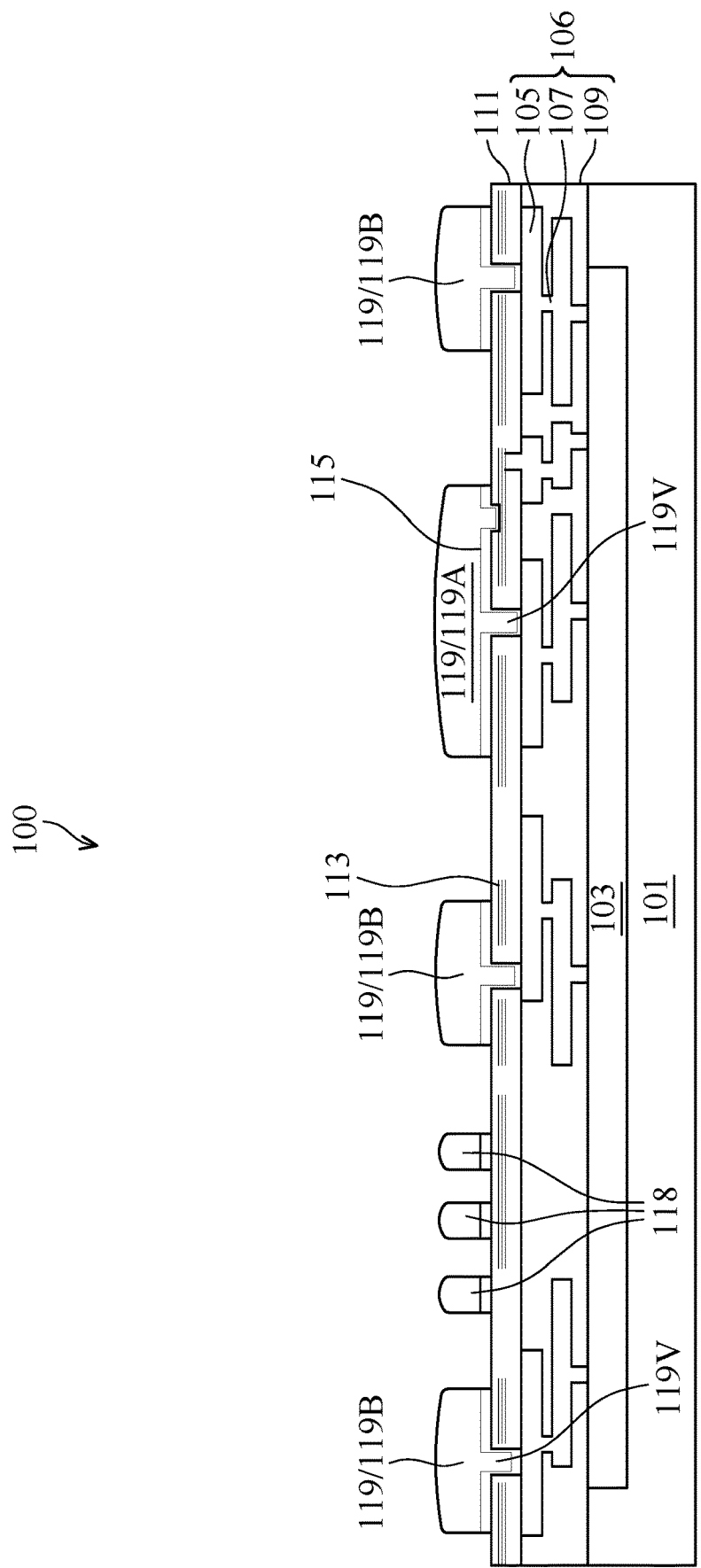

Next, in FIG. 4, conductive pads 119 (e.g., 119A and 119B) and conductive lines 118 are formed in the openings 138 over the barrier layer 115. The conductive pads 119 and the conductive lines 118 may comprise an electrically conductive material, such as copper or copper alloy (e.g., a copper-silver alloy, a copper-cobalt alloy, or the like), and may be formed using a suitable formation method such as electroplating, electroless plating, or the like. After the conductive pads 119 and the conductive lines 118 are formed, the photoresist layer 137 is removed by a suitable removal process, such as ashing. Next, an etching process is performed to remove portions of the barrier layer 115 on which the conductive pads 119 or the conductive lines 118 are not formed. As illustrated in FIG. 4, portions of the electrically conductive material fill the openings 112 (see FIG. 3) in the passivation layer 111 to form vias 119V, which electrically coupled the conductive pads 119 to underlying conductive features of the interconnect structure 106 or the MIM capacitor 113. The conductive pads 119 and the conductive lines 118 may be collectively referred to as a redistribution layer (RDL), and the vias 119V may be referred to as RDL vias. The shape of the cross-section of the conductive pad 119 may be a dome shape (e.g., with a curved upper surface), a concave shape, a polygon shape, or a rectangular (or square) shape, as examples. An area of the RDL via 119V may be between about $0.9 \times 0.9$ μm$^2$ and about $3.5 \times 3.5$ μm$^2$, as an example.

Note that in FIG. 4, some of the conductive pads 119 (e.g., 119A) are larger (e.g., having a larger width measured between opposing sidewalls) than other conductive pads 119 (e.g., 119B). In subsequent processing, C4 bumps (see, e.g., 125 in FIG. 8A) will be formed on the larger conductive pads 119A, and micro-bumps (see, e.g., 127 in FIG. 8A) will be formed on the smaller conductive pads 119B. In the illustrated embodiment, the conductive lines 118 are electrically coupled to conductive features of the interconnect structure 106, e.g., through vias 116 (see FIG. 8C), which vias 116 may not be in the cross-section of FIG. 4. In other embodiments, the conductive lines 118 are dummy lines (e.g., electrically isolated). The number of conductive pads 119 and the number of conductive lines 118 may be any suitable number, and may be arranged in any order, as skilled artisans readily appreciate. In addition, the number of RDL vias 119V under each of the conductive pad 119 may be any suitable number, such as one, two, three, or more. Furthermore, the RDL vias 119V under each of the conductive pads 119 may be centered with respect to the conductive pad 119, or may be off-center with respect to the conductive pad 119.

Figure 5:
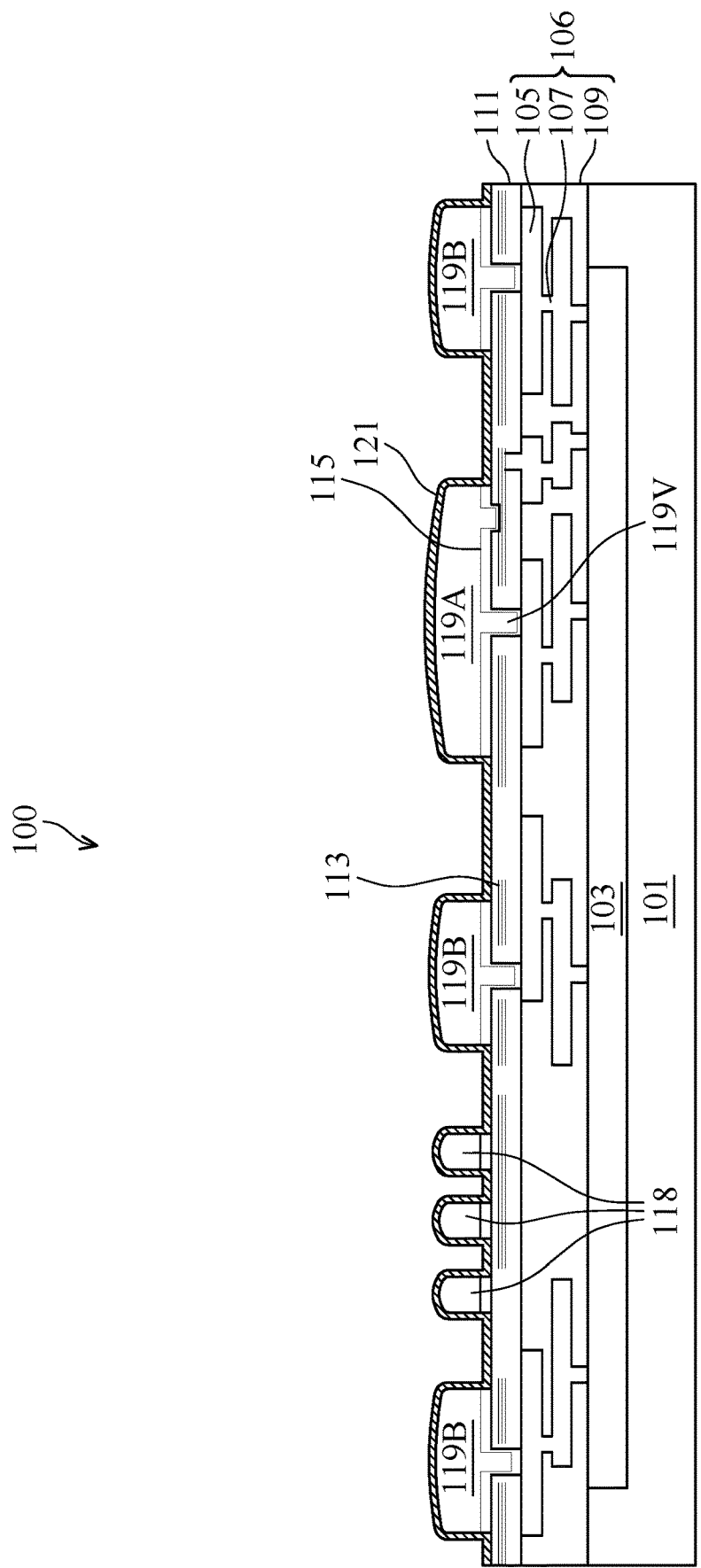

Next, in FIG. 5, a passivation layer 121 is conformally formed over the conductive pads 119, over the conductive lines 118, and over the passivation layer 111. In some embodiments, the passivation layer 121 has a multi-layered structure and includes an oxide layer (e.g., silicon oxide) and a nitride layer (e.g., silicon nitride) over the oxide layer. In other embodiments, the passivation layer 121 has a single layer structure, e.g., having a single nitride layer. The passivation layer 121 may be formed using, e.g., CVD, PVD, ALD, combinations thereof, or the like.

Figure 6:
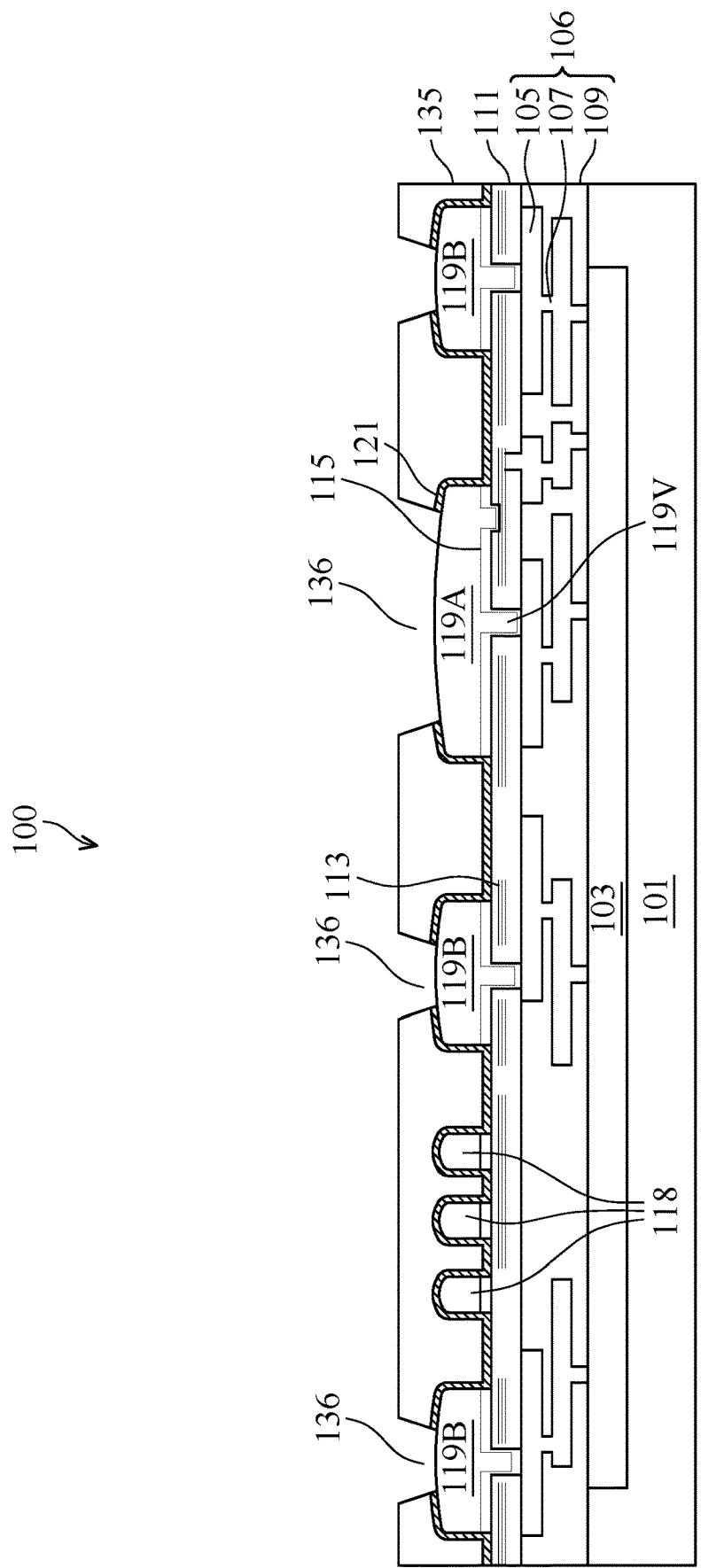

Next, in FIG. 6, a photoresist layer 135 is formed over the passivation layer 121 by, e.g., spin coating. The photoresist layer 135 is then patterned by, e.g., photolithography techniques to form openings 136 at locations where conductive bumps will be formed. Next, an etching process is performed to remove portions of the passivation layer 121 exposed by the openings 136 in the patterned photoresist layer 135. In some embodiments, the etching process is a dry etch process (e.g., a plasma etching process) using a process gas comprising a mixture of $CF_4$, $CHF_3$, $N_2$, and Ar. Other process gas may also be used, e.g., $O_2$ may be used in place of $CF_4$. After the etching process, the conductive pads 119 are exposed. Next, the photoresist layer 135 is removed by a suitable removal process, such as ashing.

Figure 7:
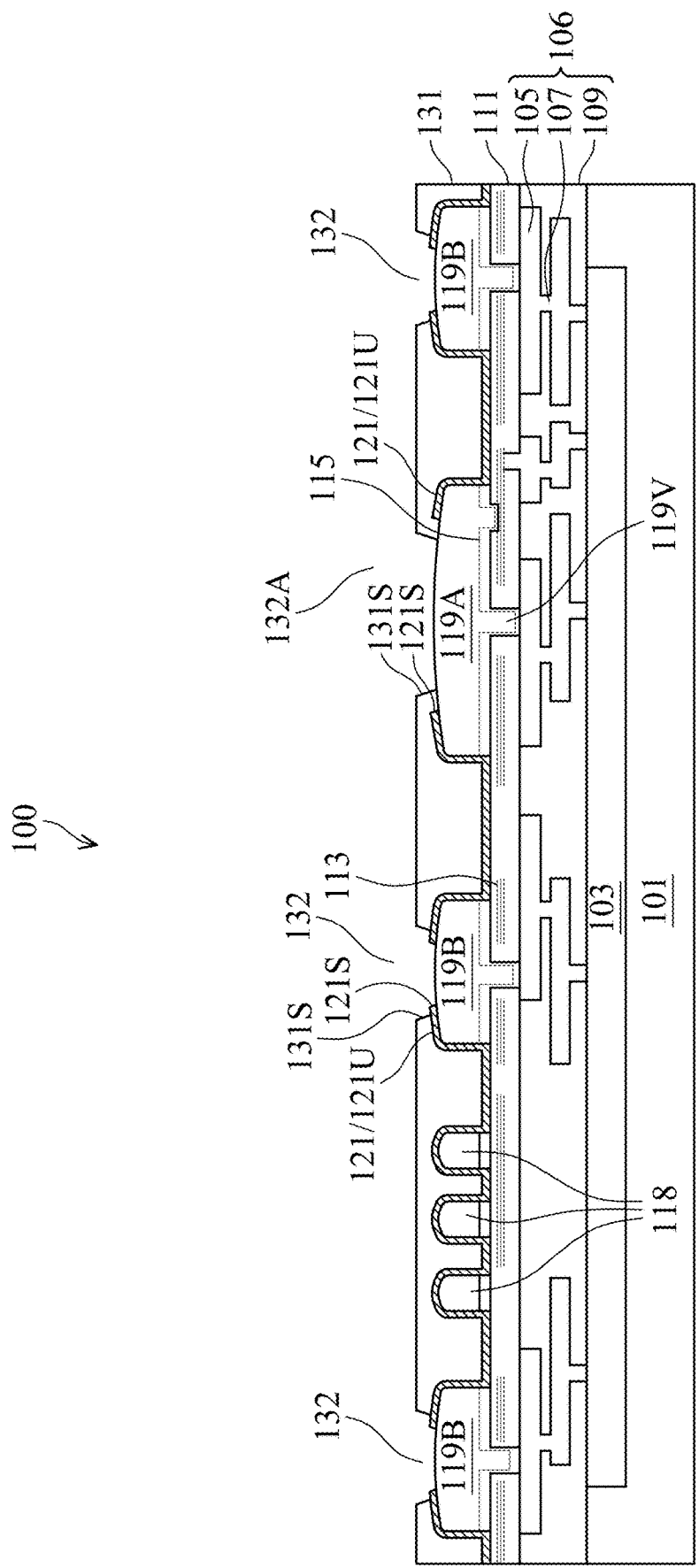

Next, in FIG. 7, a dielectric layer 131 is formed over the passivation layer 121, over the conductive pads 119, and over the passivation layer 111. Openings 132 are formed in the dielectric layer 131 to expose the underlying conductive pads 119. The dielectric layer 131 may be formed of, e.g., polymer, polyimide (PI), benzocyclobutene (BCB), an oxide (e.g., silicon oxide), or a nitride (e.g., silicon nitride). The dielectric layer 131 is illustrated as a single layer in FIG. 7 as a non-limiting example. The dielectric layer 131 may have a multi-layer structure that includes a plurality of sub-layers formed of different materials.

In some embodiments, the dielectric layer 131 is a photosensitive material such as a photosensitive polymer material, and the openings 132 are formed by using photolithography techniques. For example, the photosensitive material may be exposed to a patterned energy source (e.g., light) through, e.g., a reticle. The impact of the energy causes a chemical reaction in those parts of the photosensitive material that were impacted by the patterned energy source, thereby modifying the physical properties of the exposed portions of the photosensitive material such that the physical properties of the exposed portions of the photosensitive material are different from the physical properties of the unexposed portions of the photosensitive material. The photosensitive material may then be developed with a developer to remove the exposed portion of the photosensitive material or the unexposed portion of the photosensitive material, depending on, e.g., whether a negative photosensitive material or a positive photosensitive material is used. The remaining portions of the photosensitive material may be cured to form a patterned dielectric layer 131. The top corners of the dielectric layer 131 at the openings 132/132A are illustrated to be sharp (e.g., comprising two intersecting lines) in FIG. 7 as a non-limiting example. The top corners of the dielectric layer 131 at the openings 132/132A may be, e.g., rounded corners.

In FIG. 7, the larger opening 132, denoted as opening 132A, exposes the larger conductive pad 119A (e.g., for forming $C_4$ bump), and the other smaller openings 132 expose the smaller conductive pads 119B (e.g., for forming μ-bumps). Note that for each of the smaller openings 132, a first distance between opposing sidewalls 131S of the dielectric layer 131 exposed by the smaller opening 132 is larger than a second distance between opposing sidewalls 121S of the passivation layer 121 exposed by the smaller opening 132, such that the upper surfaces 121U and the sidewalls 121S of the passivation layer 121 are exposed by the smaller opening 132. In other words, the upper portion of the smaller opening 132 is wider than the lower portion of the smaller opening 132. The dielectric layer 131 is said to be pulled back from the sidewalls of the passivation layer 121 at the smaller openings 132, and openings having the shape of the smaller openings 132 are referred to as pulled-back openings. In some embodiments, all of the smaller openings 132 for forming μ-bumps are pulled-back openings. Due to the smaller sizes of the μ-bumps and the conductive pads 119B, it might be difficult to form the smaller openings 132 to be lined-up openings or pulled-in openings, details of the lined-up openings and the pulled-in openings are discussed hereinafter. On the other hand, due to the larger size of the C4 bumps and the conductive pads 119A, the larger opening 132A may be formed to be pulled-back openings, pulled-in openings, or lined-up openings.

In the example of FIG. 7, the larger opening 132A is a pulled-in opening, where the upper surfaces 121U and the sidewalls 121S of the passivation layer 121 underlying the larger opening 132A are covered by the dielectric layer 131. Therefore, the larger opening 132A exposes the upper surface of the larger conductive pad 119A and sidewalls of the dielectric layer 131, but the sidewalls of the passivation layer 121 are not exposed by the larger opening 132A. The width of the larger opening 132A, measured between opposing sidewalls 131S of the dielectric layer 131 facing the larger opening 132A, is larger than a largest width of the smaller openings 132, in some embodiments.

Figure 8A:
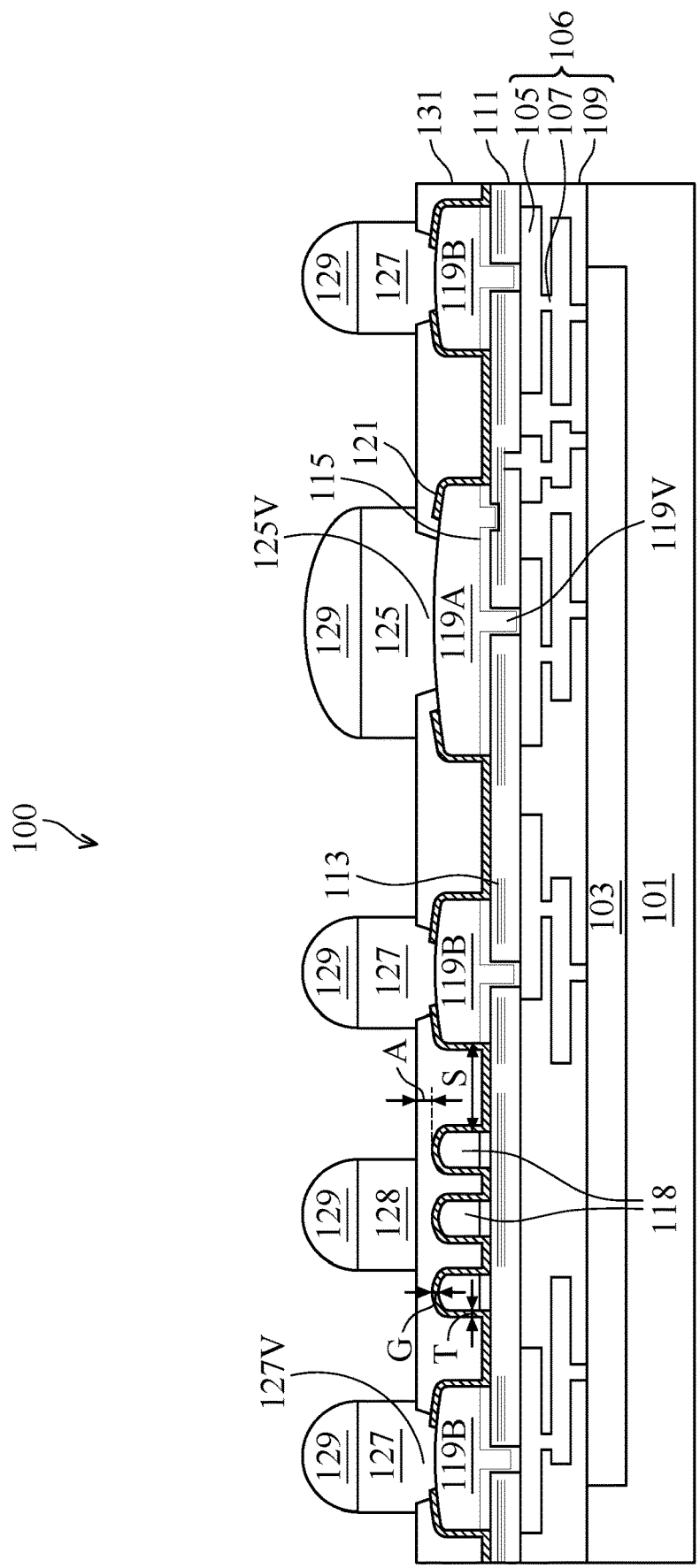

Next, in FIG. 8A, conductive bumps 127 are formed on the smaller conductive pads 119B, conductive bumps 125 are formed on the larger conductive pads 119A, and dummy bumps 128 are formed over the conductive lines 118. In an example embodiment, the conductive bumps 127 are μ-bumps having a width (e.g., measured between opposing sidewalls) between, e.g., about 3 μm and about 30 μm, and the conductive bumps 125 are C4 bumps having a width between about 32 μm and about 80 μm. In some embodiments, the dummy bump 128 has a same width as the conductive bump 127. In other embodiments, the width of the dummy bump 128 is different from that of the conductive bump 127, and is smaller than or same as the width of the conductive bump 125.

The conductive bumps 127/125 and the dummy bumps 128 may be formed by forming a seed layer over the dielectric layer 131 and along sidewalls and bottoms of the openings 132/132A; forming a patterned photoresist layer over the seed layer, where openings of the patterned photoresist layer are formed at locations where the conductive bumps 127/125 and the dummy bumps 128 are to be formed; forming (e.g., plating) an electrically conductive material over the seed layer in the openings; removing the patterned photoresist layer; and removing portions of the seed layer over which no conductive bumps 127/125 or no dummy bumps 128 are formed. Note that portions of the electrically conductive material fill the openings 132 and the openings 132A to form bump vias 127V and bump vias 125V, respectively, which bumps vias 127V/125V electrically couple the conductive bumps 127/125 to the underlying conductive pads 119B/119A. The dummy bumps 128 are electrically isolated (e.g., not electrically coupled to other conductive features of the semiconductor device 100). After the conductive bumps 127/125 and the dummy bumps 128 are formed, solder regions 129 may be formed on the upper surfaces of the conductive bumps 127/125 and the dummy bumps 128.

The dummy bumps 128 may be formed to balance the bump density of the conductive bumps (e.g., the total area of the conductive bumps in a unit area, measured in a top view of the device) and to improve co-planarity of the conductive bumps (e.g., 125, 127, 128) formed. If the bump densities of the conductive bumps in different areas of the semiconductor device 100 are not balanced, during the plating process to form the conductive bumps, the conductive bumps in areas with lower bump density may be formed taller than conductive bumps in areas with high bump density, thereby resulting in reduced co-planarity of the conductive bumps. Therefore, the dummy bumps 128 may be formed in areas of low bump density to even out the bump densities between different areas of the semiconductor device and to achieve improved co-planarity of the conductive bumps formed.

In FIG. 8A, the dummy bump 128 is formed over three conductive lines 118 as a non-limiting example. The number of conductive lines 118 under each dummy bump 128 may be any suitable number, such as one. The number of bump vias 127V or 125V under a respective conductive bump (e.g., 127 or 125) is one, as illustrated in FIG. 8A. This is, of course, merely a non-limiting example. The number of bump vias 127V or 125V under a respective conductive bump (e.g., 127 or 125) may be any suitable number, such as one, two, three, or more. In addition, the one or more bump vias 127V or 125V under each respective conductive bump (e.g., 127 or 125) may be centered with respect to the conductive bump, or may be off-center with respect to the conductive bump. In some embodiments, when the dummy bump 128 is wider than the conductive lines 118, the dummy bump 128 is formed over more than one conductive lines 118 to provide more support for the dummy bump 128 and more integration density for the conductive lines 118.

Note that in FIG. 8A, due to the difference in the shape of the opening 132 (e.g., a pulled-back opening) and the shape of the opening 132A (e.g., a pulled-in opening), the bump via 127V and the bump via 125V have different shapes. For example, the bump via 127V has an upper portion (e.g., a portion above the upper surface of the passivation layer 121) and a lower portion (e.g., a portion below the upper surface of the passivation layer 121), where the upper portion is wider than the lower portion such that there is a lateral offset between a sidewall of the upper portion and a respective sidewall of the lower portion. In particular, sidewalls of the upper portion of the bump via 127V contact and extend along sidewalls of the dielectric layer 131, and sidewalls of the lower portion of the bump via 127V contact and extend along sidewalls of the passivation layer 121. As illustrated in FIG. 8A, there is a step change in the width of the bump via 127V between the upper portion and the lower portion of the bump via 127V. In other words, there is an abrupt (e.g., non-continuous) change in the width of the bump via 127V at the interface between the upper portion and the lower portion of the bump via 127V.

In contrast, sidewalls of the bump via 125V in FIG. 8A contact and extend along sidewalls of the dielectric layer 131. The width of the bump via 125V may be constant (e.g., having sidewalls perpendicular to a major upper surface of the substrate 101) or may change gradually (e.g., continuously) as the bump via 125V extends toward the substrate 101. In the example of the FIG. 8A, the sidewalls of the bump via 125V have a liner profile (e.g., a slanted straight line), and the width of the bump via 125V decreases gradually as the bump via 125V extends toward the substrate 101. Note that there is a gap between the sidewall of the bump via 125V and a respective sidewall of the passivation layer 121, and the dielectric layer 131 fills the gap and contacts the upper surface of the conductive pads 119A. In other words, the bump via 125V is spaced apart (e.g., separated) from the passivation layer 121 by the dielectric layer 131.

In the example of FIG. 8A, a thickness A of a portion of the dielectric layer 131 disposed over the passivation layer 121 on the conductive line 118 is between about 2 μm and about 20 μm. A space S between the conductive line 118 and an adjacent conductive pad 119 is larger than about 1.5 μm if the conductive pad is the smaller conductive pad 119B (e.g., with a μ-bump formed thereon), or is larger than about 4 μm if the conductive pad is the larger conductive pad 119A (e.g., with a C4 bump formed thereon). FIG. 8A also illustrates a thickness T for sidewall portions of the passivation layer 121 (e.g., portions along sidewalls of the conductive pad 119 or along sidewalls of the conductive line 118), and a thickness G for upper portions of the passivation layer 121 (e.g., portions along upper surfaces of the conductive pad 119 or along upper surfaces of the conductive line 118), where the thickness G is between about 0.5 μm and about 5 μm, and where a ratio between T and G (e.g., T/G), referred to as the step coverage of the passivation layer 121, is between about 30% and about 90%.

Figure 8B:
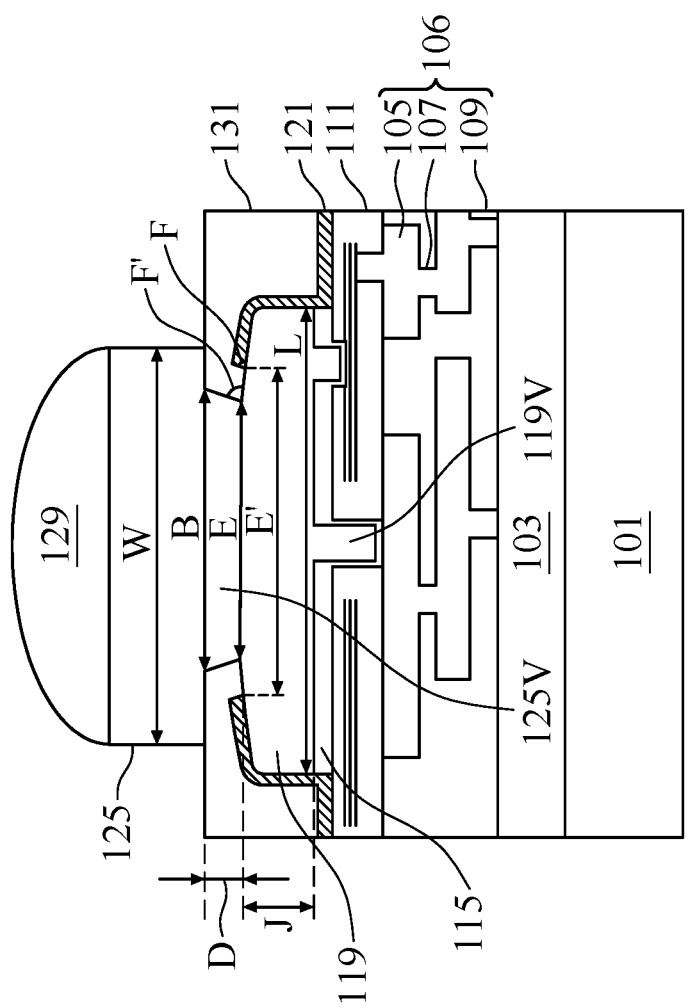

FIG. 8B illustrates a zoomed-in view of a portion of the semiconductor device 100 of FIG. 8A comprising a conductive bump 125. Dimensions of the conductive bump 125 and its surrounding structures are discussed below. In addition to, or in parallel to, the discussion of the dimensions of the conductive bumps 125 (e.g., a C4 bump), the dimensions of the conductive bump 127 (e.g., a μ-bump) is also discussed where appropriate. Note that some features, such as the thickness of the passivation layer 121 or shape of the cross-section of the conductive pads 119, are independent from the type of conductive bumps (e.g., C4 bump or μ-bump). In addition, some features, such as the width B at the top of the opening in the dielectric layer 131, applies for embodiments where the dielectric layer 131 is formed.

As illustrated in FIG. 8B, a width W of the conductive bump 125 (e.g., a C4 bump) is between about 32 μm and about 80 μm. In contrast, a width W of the conductive bump 127 (e.g., a μ-bump) is between about 10 μm and about 30 μm. A width B at the top of the opening in the dielectric layer 131 is between about 5 μm and about 25 μm for pulled-back openings for μ-bumps, and is between about 10 μm and about 80 μm for pulled-back openings, pulled-in openings, and lined-up openings for C4 bumps. A width E at the bottom of the opening in the dielectric layer 131 is between about 5 μm and about 30 μm for pulled-back openings for μ-bumps, and is between about 10 μm and about 80 μm for pulled-back openings, pulled-in openings, and lined-up openings for C4 bumps. A height D for the bump via 125V (or 127V) is larger than the thickness A (see FIG. 8A) of a portion of the dielectric layer 131, and is larger than the thickness G (see FIG. 8A) of the upper portions of the passivation layer 121. For embodiments where the dielectric layer 131 is omitted (see FIG. 15), the height D is equal to the thickness G.

Still referring to FIG. 8B, a width L of the conductive pad 119 is between about 15 μm and about 90 μm if the conductive pad is the larger conductive pad 119A with C4 bump formed thereon, or is between about 3.5 μm and about 15 μm if the conductive pad is the smaller conductive pad 119B with a μ-bump formed thereon. A ratio between the width L of the conductive pad 119 and the spacing S (see FIG. 8A) is equal to or larger than one. A width E' of the opening in the passivation layer 121 is between about 2 μm and about 28 μm for μ-bumps, and is between about 30 μm and about 50 μm for C4 bumps. A height J of the conductive pad 119 (or of the conductive line 118) is between about 2 μm and about 9 μm. FIG. 8B further illustrates an angle F' between the sidewall of the dielectric layer 131 and the upper surface of the conductive pad 119, and an angle F between the sidewall of the passivation layer 121 and the upper surface of the conductive pad 119, where F may be between 5 degrees and 90 degrees (e.g., 5<F<90), and F' is larger than 5 degrees and smaller than or equal to 90 degrees (e.g., 5<F'≥90). If the openings 132 or 132A is a lined-up opening (see 132A in FIG. 13), then the corresponding F and F' are equal. Otherwise, F may be different from F'.

Figure 8C:
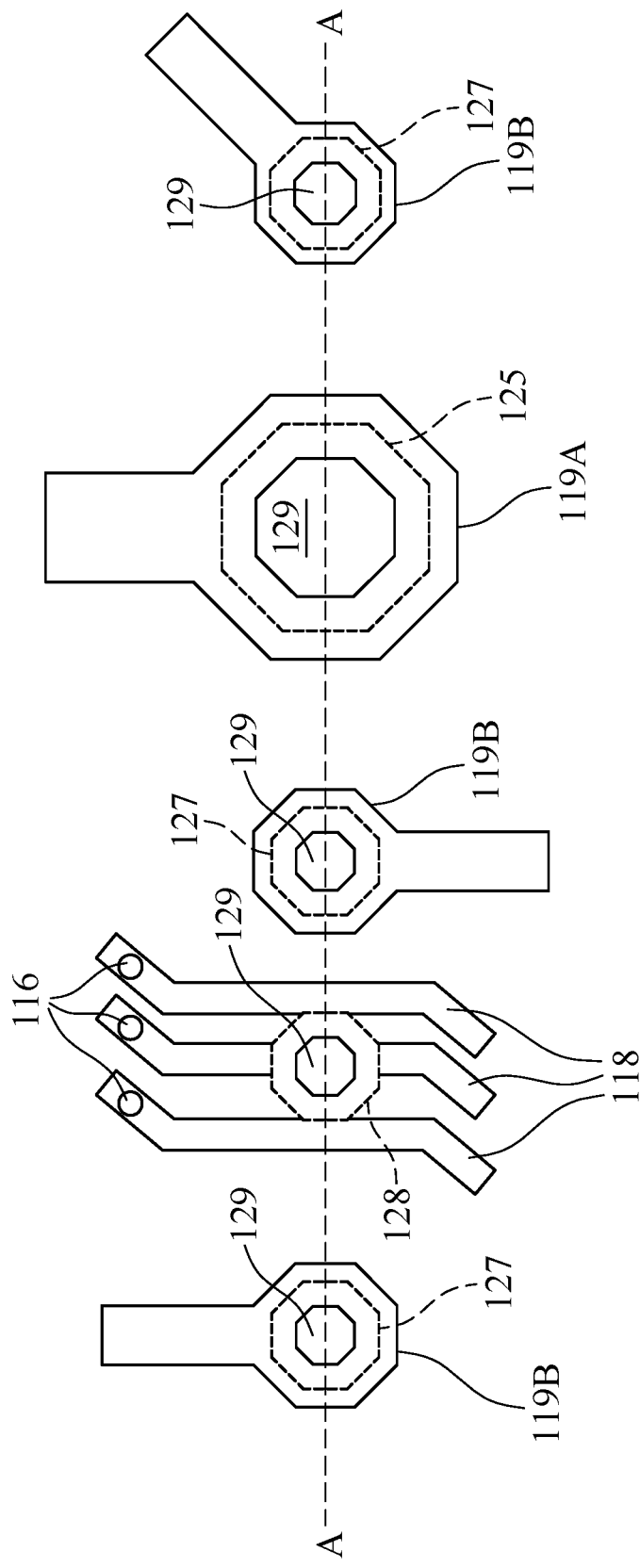

FIG. 8C illustrates a plan view of the semiconductor device 100 of FIG. 8A, and FIG. 8A corresponds to the cross-sectional view along cross-section A-A of FIG. 8C. Note that for simplicity, not all features are illustrated in FIG. 8C. The conductive pads 119 in FIG. 8C are illustrated to have octagon shapes as a non-limiting example. Other shapes, such as circle shapes, oval shapes, rectangular shape, other polygon shapes, or the like, are also possible and are fully intended to be included within the scope of the current disclosure. As illustrated in FIG. 8C, the dummy bump 128 overlies the conductive lines 118, and the conductive lines 118 are electrically coupled to underlying conductive features (e.g., the interconnect structure 106) through vias 116.

Figure 8D:
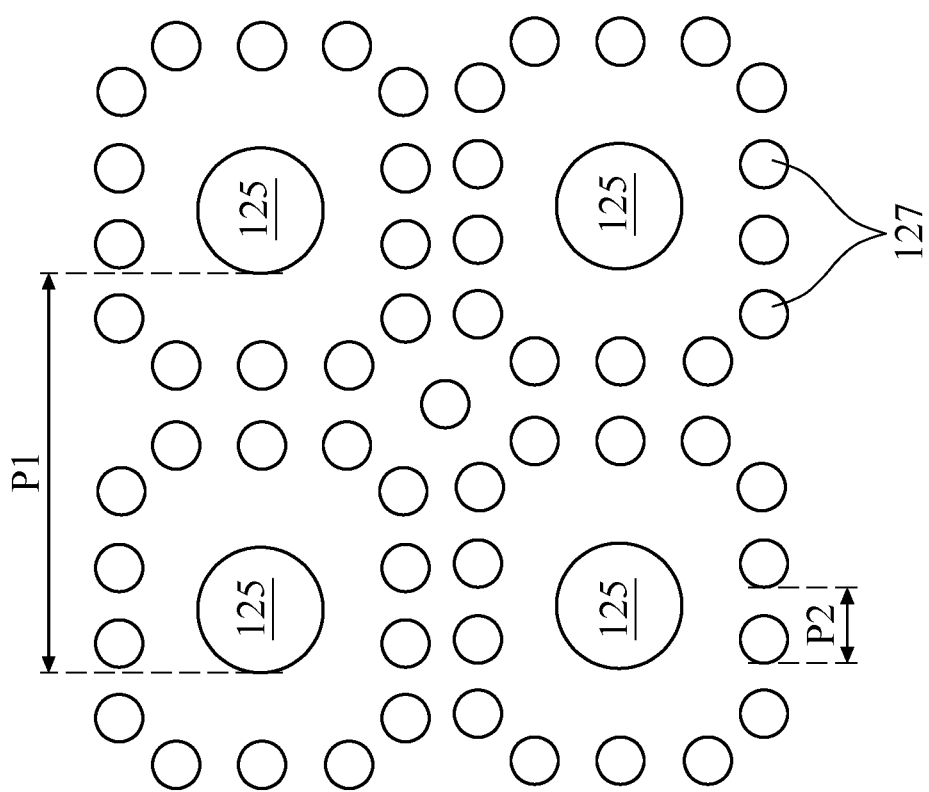

FIG. 8D illustrates an example of the arrangement of the conductive bumps (e.g., 125, 127) of the semiconductor device 100. FIG. 8D corresponds to a top view of a portion of the semiconductor device 100 of FIG. 8A, which portion may be different from the portion illustrated in FIG. 8A. Note that for simplicity, not all features are illustrated in FIG. 8D. As illustrated in FIG. 8D, conductive bumps 125 (e.g., C4 bumps) and conductive bumps 127 (e.g., μ-bumps) are interposed (e.g., interleaved) with each other in a same region of the semiconductor device 100. For example, the conductive bumps 127 are disposed around and between the conductive bumps 125. In addition, each of the conductive bumps 125 is also interposed between the conductive bumps 127. The layout of the conductive bumps (e.g., 125, 127) in FIG. 8D differs from other designs where C4 bumps and μ-bumps are formed in different regions of the semiconductor device (e.g., not interposed between each other) and therefore, may also be referred to as a hybrid layout (or hybrid bump scheme) for the conductive bumps. In some embodiments, the conductive bumps 125 (e.g., C4 bumps) and conductive bumps 127 (e.g., μ-bumps) are formed in different groups in different regions of the semiconductor device (e.g., not interposed between each other).

The conductive bumps 127 in FIG. 8D form a circle around each of the conductive bumps 125. This is, of course, merely a non-limiting example. The conductive bumps 127 around each of the conductive bumps 125 may form any shape, such as a rectangular shape, a triangular shape, a circular shape, an oval shape, a polygon shape, as examples. In addition, the conductive bumps 127 around each conductive bump 125 may be formed in multiple rows and multiple columns. In some embodiments, a pitch P1 between the conductive bumps 125 is between about 50 μm and about 180 μm, such as 75 μm, and a pitch P2 between the conductive bumps 127 is between about 10 μm and about 45 μm, such as 25 μm.

Advantages are achieved for the disclosed semiconductor device 100 and other disclosed embodiments (e.g., 100A, 100B, 100C) herein. For example, the dummy bump 128 is formed over conductive lines 118 instead of dummy conductive pads. This removes the need to form a dummy conductive pad under each of the dummy bump 128, and allows for more flexible design and layout. For example, the space under the dummy bump 128 can now be used to route conductive lines 118. As another example, the formation of the dielectric layer 131 removes some of the difficulties associated with forming the conductive bumps (e.g., 125, 127, 128) and improves device reliability and manufacturing yield. Recall that to form the conductive bumps, a seed layer is formed first, then the conductive bumps are formed (e.g., plated) over the seed layer. Without the dielectric layer 131, the seed layer would have to be formed conformally over the conductive pads 119 and over the conductive lines 118. In advanced semiconductor manufacturing, the small gaps between the conductive pads 119 and the conductive lines 118 may have high aspect-ratios, and it may be difficult to form the seed layer in these small gaps, which may result in the conductive bumps not being formed properly. In addition, after the conductive bumps are formed, portions of the seed layer over which no conductive bump is formed need to be removed. If such portions of the seed layer are in the small gaps, it may be difficult to remove the seed layer, which may result in electrical short between conductive pads 119. In contrast, with the dielectric layer 131 formed, the seed layer is formed over the dielectric layer 131 and in the openings 132/132A, which openings 132/132A have much smaller aspect-ratios, and therefore, the seed layer can be easily formed in the openings 132 and easily removed from the openings 132. Furthermore, the hybrid layout allows for more flexible placement of the conductive bumps in the design to accommodate different design requirements.

Figure 9:
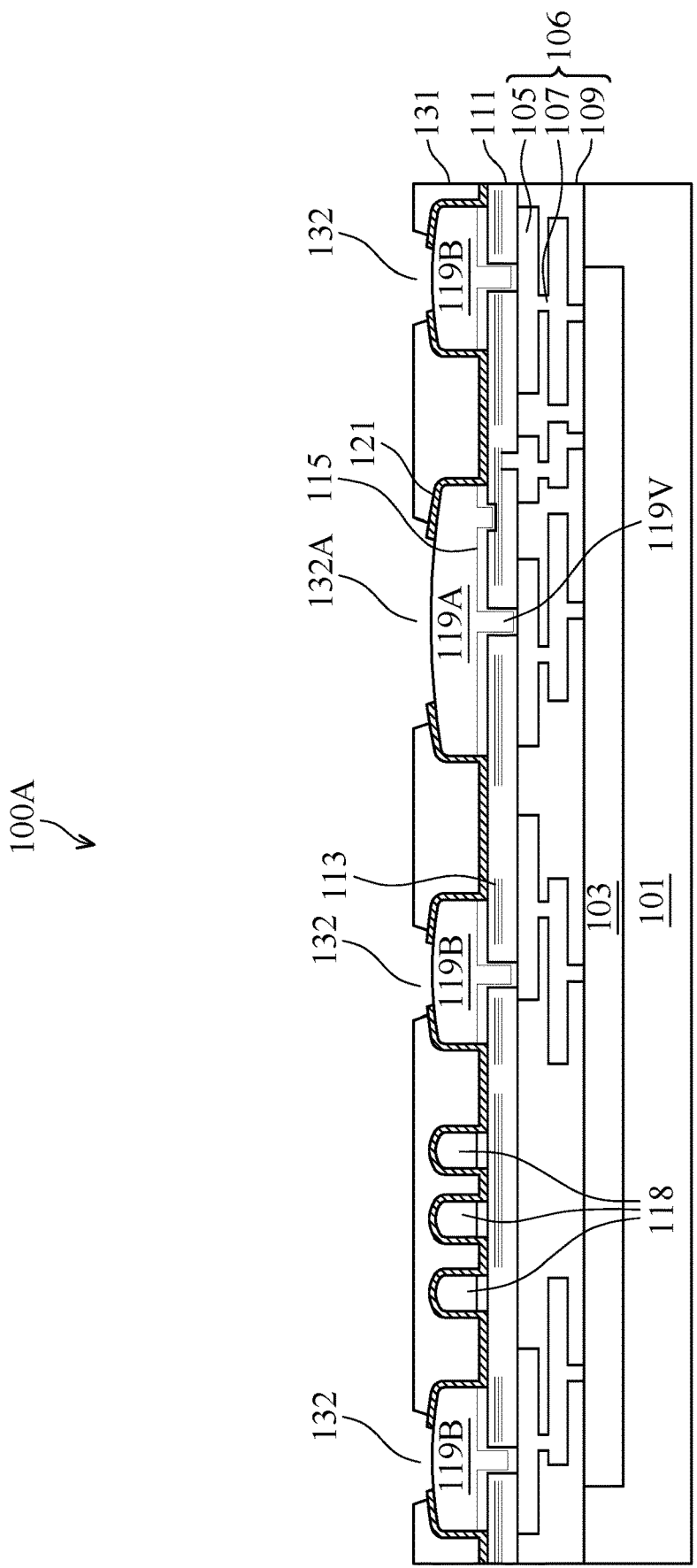
FIGS. 9 and 10 illustrate cross-sectional views of a semiconductor device at various stages of manufacturing, in accordance with another embodiment.
Figure 10:
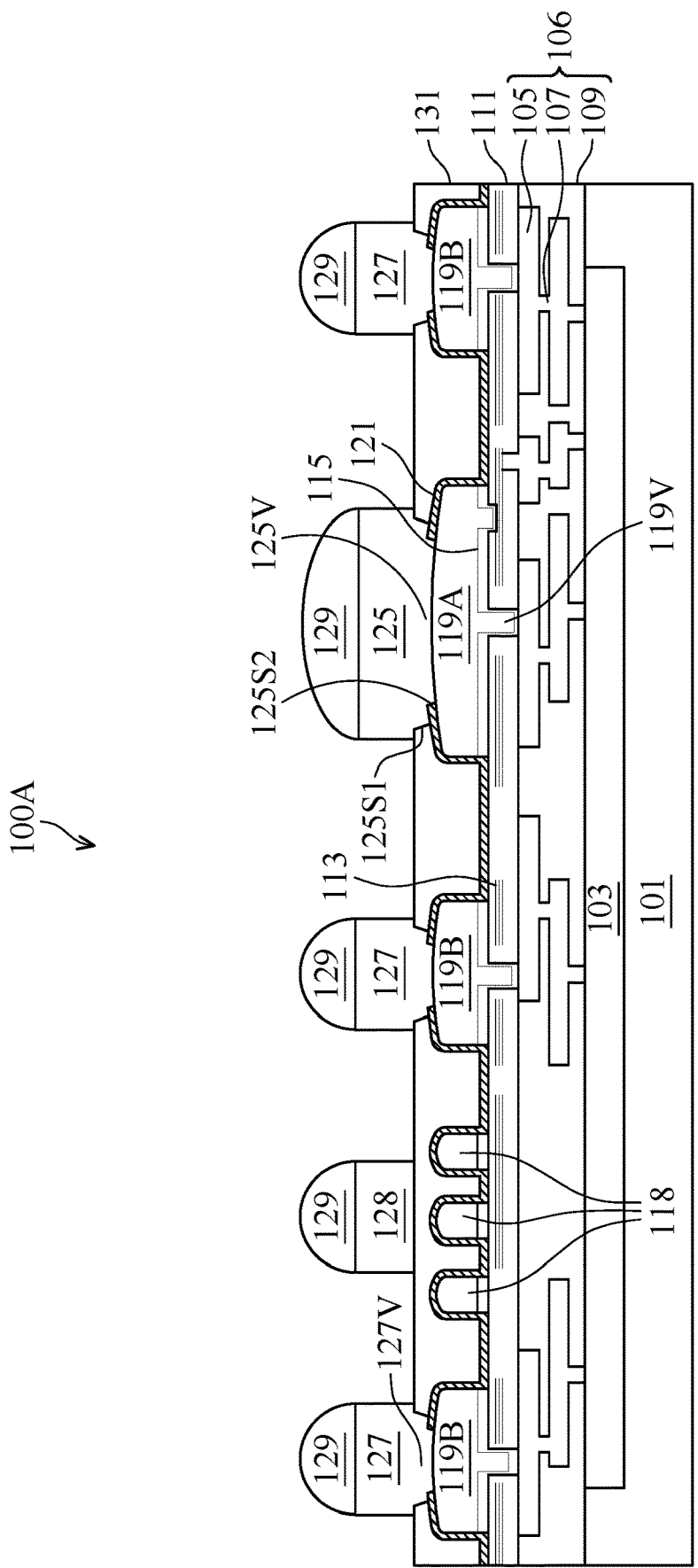

FIGS. 9 and 10 illustrate cross-sectional views of a semiconductor device 100A at various stages of manufacturing, in accordance with another embodiment. The semiconductor device 100A is similar to the semiconductor device 100, but with pulled-back openings 132A for the conductive pads 119A. The processing of FIG. 9 follows the processing of FIGS. 1A, 1B, and 2-6. In FIG. 9, the dielectric layer 131 is formed, and openings 132/132A are formed, using the same or similar processing as discussed above with reference to FIG. 7. Note that in FIG. 9, the opening 132A is formed as a pulled-back opening. This may be achieved by, e.g., using a reticle with a larger opening at the location of the opening 132A during the photolithography process to form the opening 132A. Therefore, in the example of FIG. 9, all the openings 132/132A are pulled-back openings.

Next, in FIG. 10, conductive bumps 125 (e.g., C4 bumps) are formed over the larger conductive pads 119A, conductive bumps 127 (e.g., μ-bumps) are formed over the smaller conductive pads 119B, and dummy bumps 128 are formed over the conductive lines 118, following the same or similar processing as FIG. 8A, details are not repeated. In the example of FIG. 10, the bumps vias 125V and 127V have similar shapes (e.g., having upper portions and lower portions with different widths, and having a step change in the width at the interface between the upper portion and the lower portion). Details are the same as or similar to those of the bump vias 127V in FIG. 8A, thus not repeated.

FIGS. 11-14 illustrate cross-sectional views of a semiconductor device 100B at various stages of manufacturing, in accordance with another embodiment. The semiconductor device 100B is similar to the semiconductor device 100, but with lined-up openings 132A for the conductive pads 119A.

Figure 11:
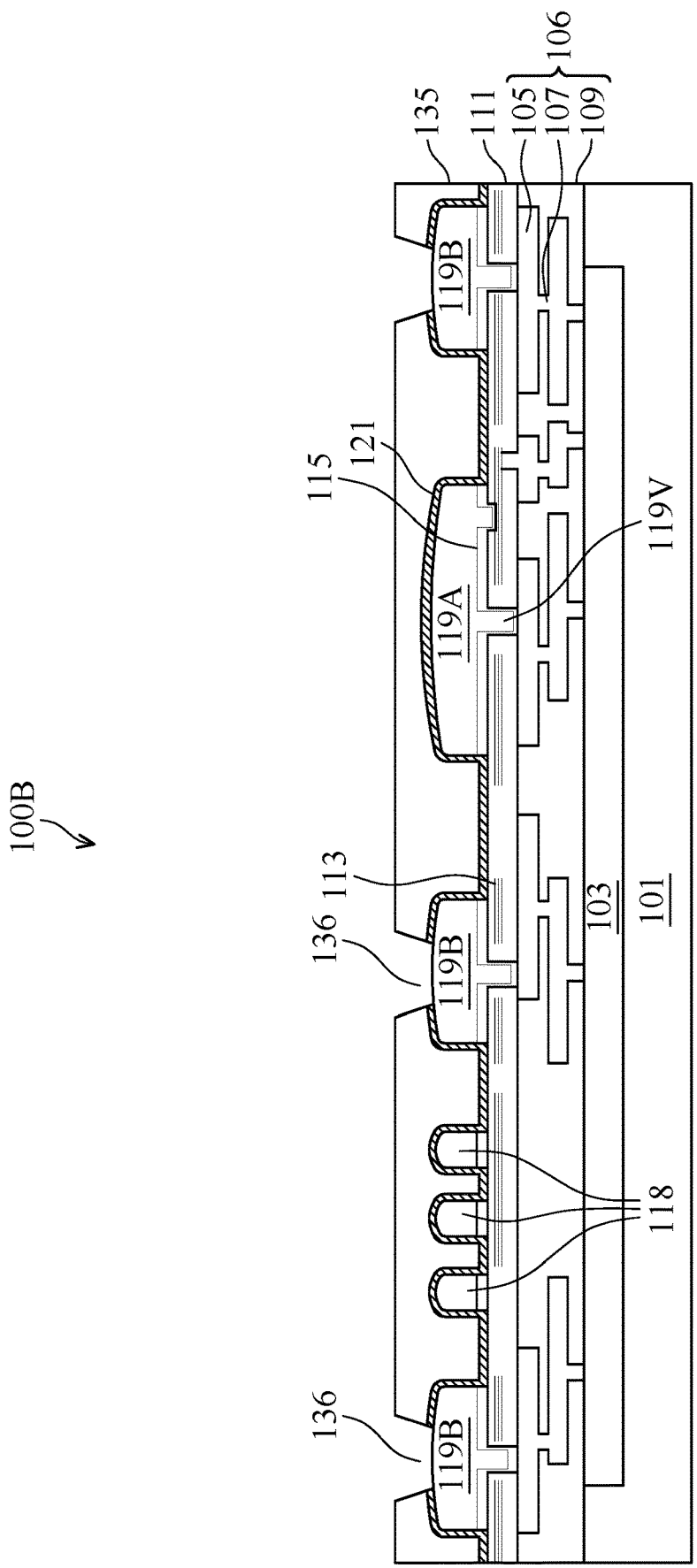
FIGS. 11-14 illustrate cross-sectional views of a semiconductor device at various stages of manufacturing, in accordance with another embodiment.

The processing of FIG. 11 follows the processing of FIGS. 1A, 1B, and 2-5. In FIG. 11, the patterned photoresist layer 135 is formed, and an etching process is performed to form openings 136 that extend through the passivation layer 121 to expose the smaller conductive pads 119B, using the same or similar processing as FIG. 6. Note that unlike the processing of FIG. 6, no opening is formed over the larger conductive pad 119A. Therefore, the larger conductive pad 119A is covered by the photoresist layer 135. The photoresist layer 135 is removed after the openings 136 are formed.

Figure 12:
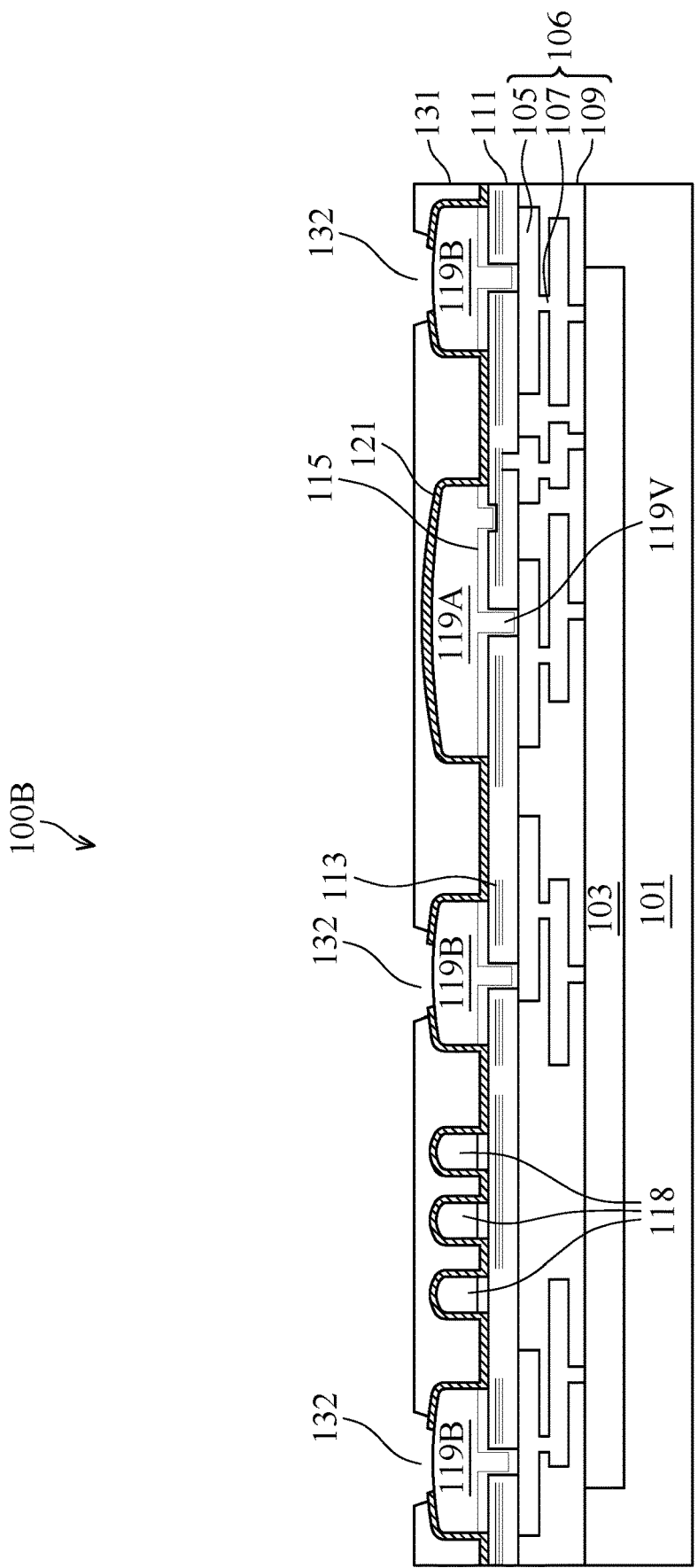

Next, in FIG. 12, the dielectric layer 131 is formed, and openings 132 are formed to expose the underlying smaller conductive pads 119B, using the same or similar processing as FIG. 7. Note that unlike the processing of FIG. 7, no opening is formed over the larger conductive pad 119A in the dielectric layer 131.

Figure 13:
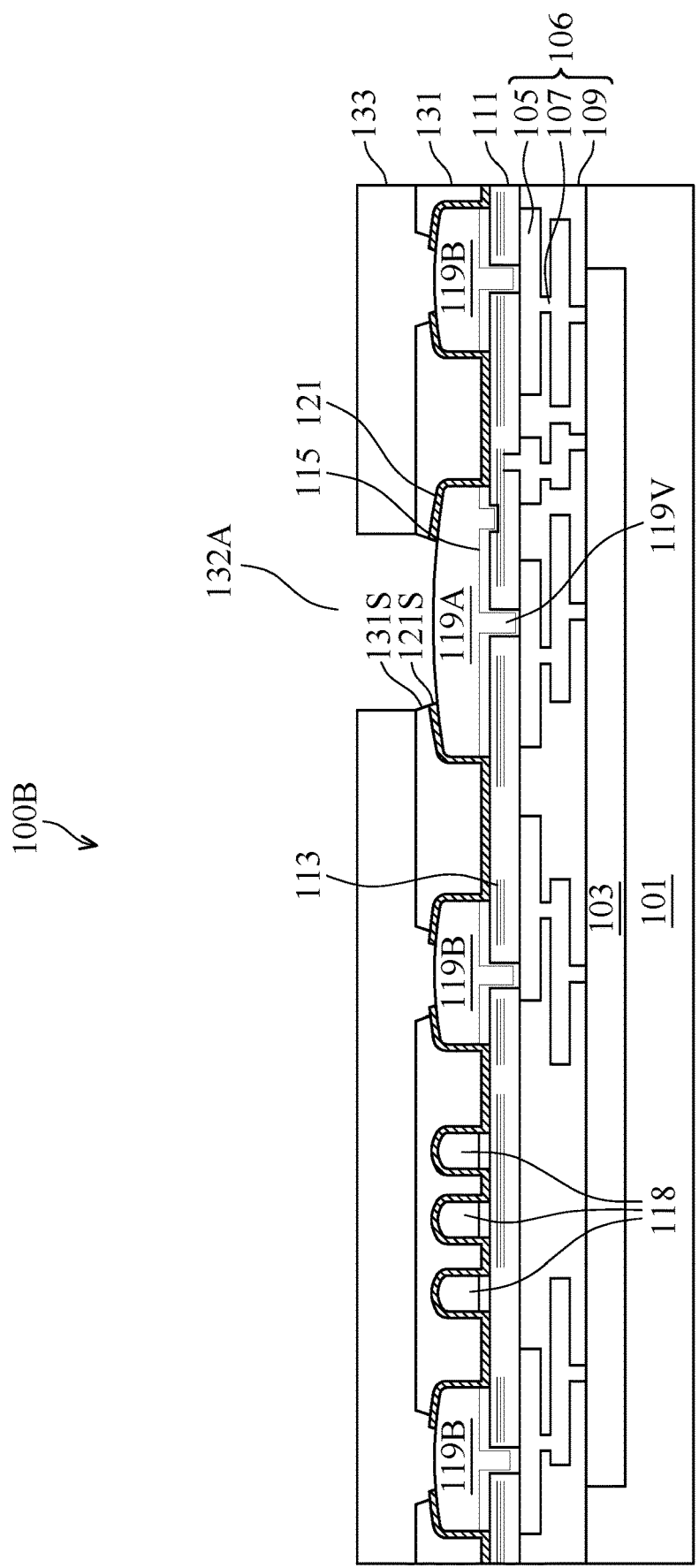

Next, in FIG. 13, a photoresist layer 133 is formed over the dielectric layer 131. The photoresist layer 133 fills the openings 132. Next, the photoresist layer 133 is patterned to form openings 132A over the larger conductive pads 119A. The patterned photoresist layer 133 is then used as an etching mask for a subsequent etching process, which subsequent etching process may be the same as or similar to the etching process in FIG. 6 for forming the openings 136. As illustrated in FIG. 13, after the etching process, openings 132A, which are lined-up openings, are formed over and expose the underlying larger conductive pads 119A. For each lined-up opening 132A, the sidewall 131S of the dielectric layer 131 exposed by the opening and a respective sidewall 121S of the passivation layer 121 exposed by the opening are aligned along a same line (e.g., a straight line or a slanted line with respect to a major upper surface of the substrate 101), as illustrated in the example of FIG. 13. In some embodiments, the sidewall 131S of the dielectric layer 131 and the respective sidewall 121S of the passivation layer 121 may intersect at the interface between the dielectric layer 131 and the passivation layer 121 without a lateral offset in between. The photoresist layer 133 is removed after the lined-up openings 132A are formed.

Figure 14:
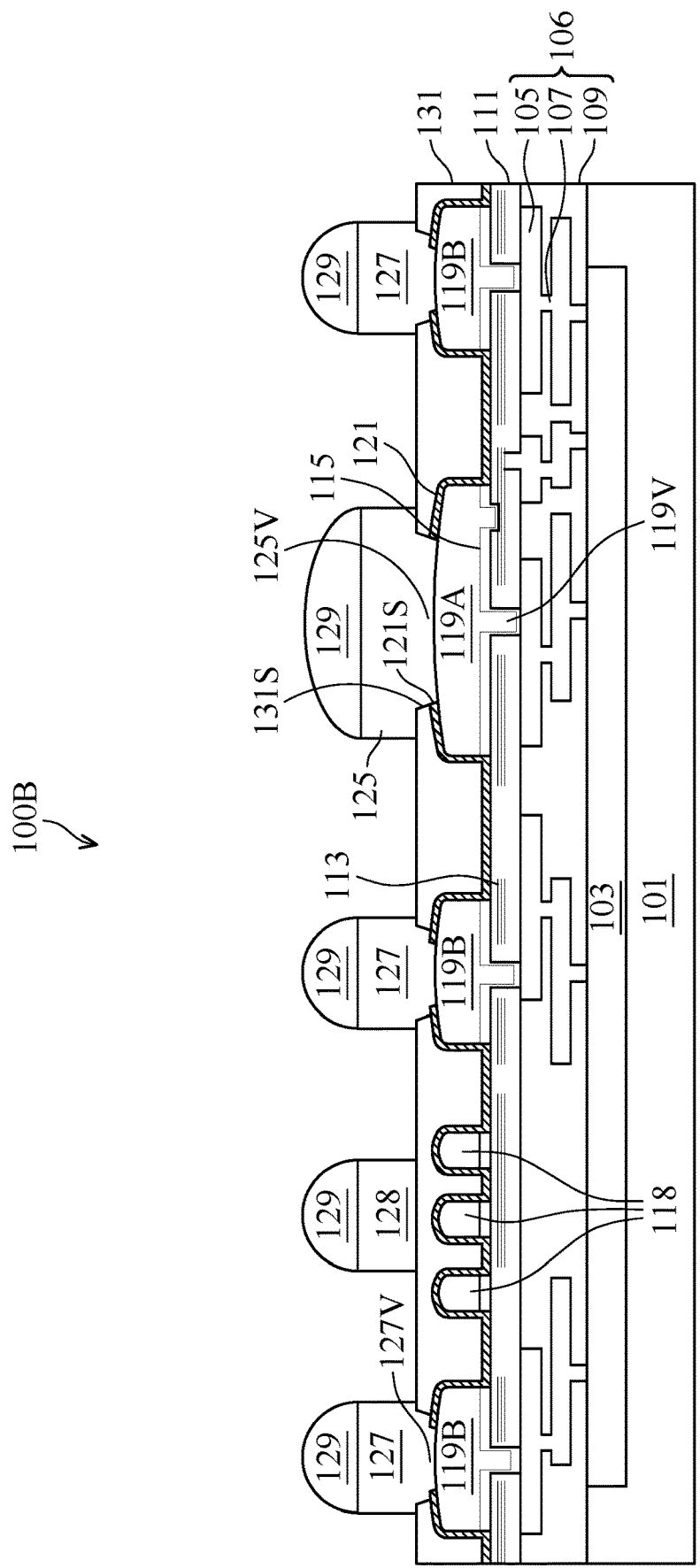

Next, in FIG. 14, conductive bumps 125 (e.g., C4 bumps) are formed over the larger conductive pads 119A, conductive bumps 127 (e.g., μ-bumps) are formed over the smaller conductive pads 119B, and dummy bumps 128 are formed over the conductive lines 118, following the same or similar processing as FIG. 8A, details are not repeated. In the example of FIG. 14, the bump via 127V of the conductive bump 127 (e.g., μ-bump) has the same shape as the bump via 127V of FIG. 8A. The sidewalls of the bump via 125V contact and extend along sidewalls 131S of the dielectric layer 131, and contact and extend along sidewalls 121S of the passivation layer 121. In some embodiments, the bump via 125V of the conductive bump 125 (e.g., C4 bump) has a width (e.g., measured between opposing sidewalls of the bump via 125V) that is constant (e.g., having straight sidewalls) or changes continuously (e.g., gradually without a step change) as the bump via 125V extends toward the substrate.

Figure 15:
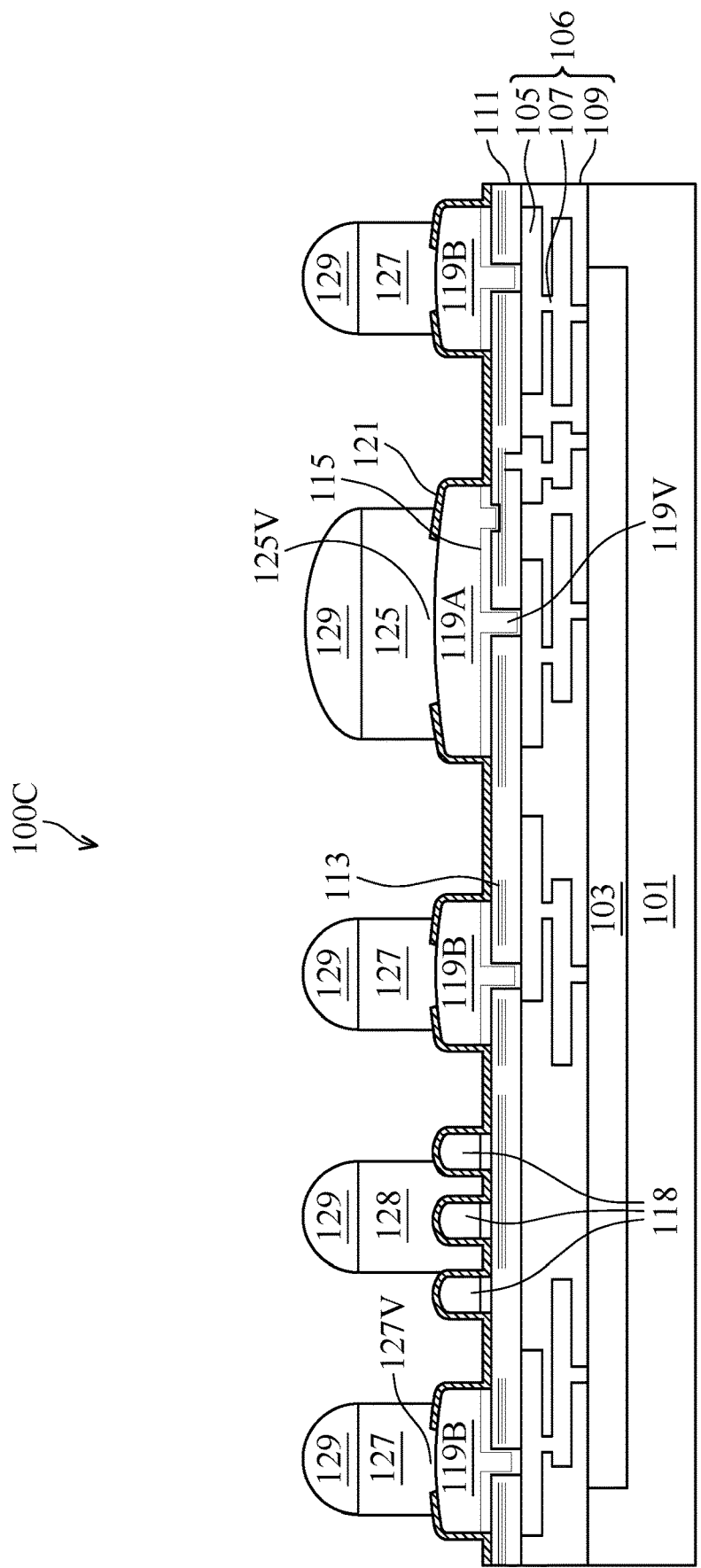
FIG. 15 illustrates a cross-sectional view of a semiconductor device, in accordance with yet another embodiment.

FIG. 15 illustrates a cross-sectional view of a semiconductor device 100C, in accordance with yet another embodiment. The semiconductor device 100C is similar to the semiconductor device 100 of FIG. 8A, but without the dielectric layer 131. As illustrated in FIG. 15, the conductive bumps 125/127 and the dummy bumps 128 are formed directly on (e.g., in physical contact with) the passivation layer 121. Bump vias 125V and 127V extend through the passivation layer 121, and electrically couple the conductive bumps 125 and 127 to the underlying conductive pads 119A and 119B, respectively. Note that the dummy bump 128 is electrically isolated from the conductive lines 118 by the passivation layer 121. Lower portions of the dummy bumps 128 extend into the gaps between the conductive lines 118 in the example of FIG. 15, and therefore, are closer to the substrate 101 than the conductive bumps 125/127.

Figure 16A:
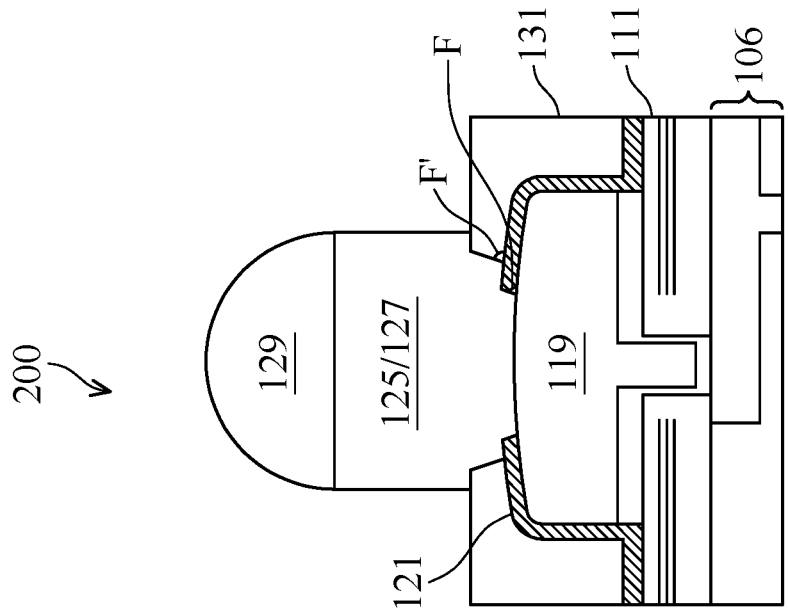
FIGS. 16A and 16B illustrate cross-sectional views of a semiconductor device with different processing sequences, in accordance with some embodiments.
Figure 16B:
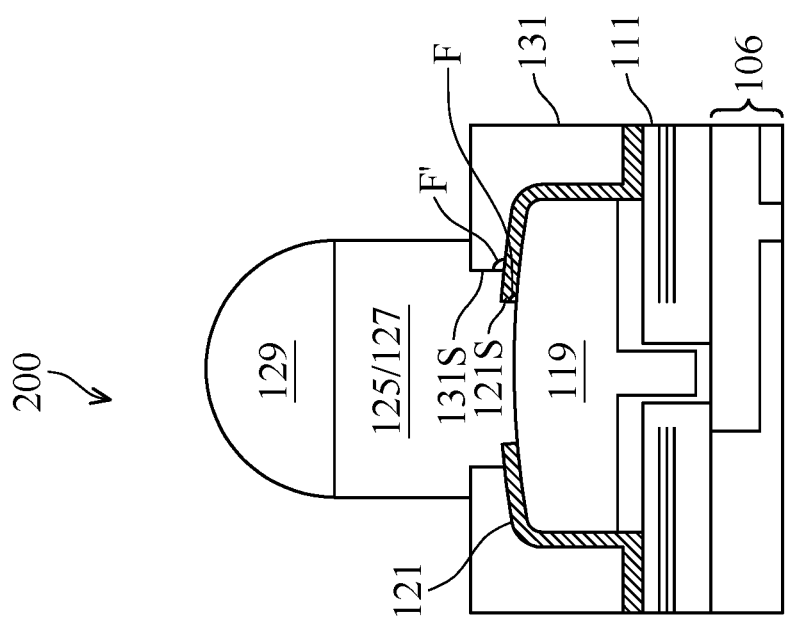

FIGS. 16A and 16B illustrate cross-sectional views of a semiconductor device 200 with different processing sequences, in accordance with some embodiments. The semiconductor device 200 may be formed by a same or similar process as the semiconductor device 100A of FIG. 10. FIGS. 16A and 16B illustrate the effect of the sequence of the processing steps on the angles F and F', where the angle F is between the sidewall 121S of the passivation layer 121 and the underlying upper surface of the conductive pad 119, and the angle F' is between the sidewall 131S of the dielectric layer 131 and the underlying upper surface of the passivation layer 121.

For the semiconductor device 200 in FIG. 16A, after the passivation layer 121 is formed over the conductive pad 119, the dielectric layer 131 is formed over the passivation layer 121. In an embodiment, the dielectric layer 131 is a photosensitive polymer layer and is formed by spin coating. Next, the dielectric layer 131 (e.g., a photosensitive polymer layer) is exposed to a patterned energy source (e.g., light) and developed to form a patterned dielectric layer 131. The patterned dielectric layer 131 is used as an etching mask in a subsequent etching process, which subsequent etching process etches through the passivation layer 121 to form openings that expose the conductive pads 119. After the openings in the passivation layer 121 are formed, the dielectric layer 131 (e.g., a photosensitive polymer layer) is cured, e.g., by a thermal process. In other words, curing of the dielectric layer 131 is performed after the openings in the passivation layer 121 are formed. Next, the conductive bumps 125 or 127 are formed, following similar processing as discussed above.

Note that in FIG. 16A, by curing the dielectric layer 131 after the openings in the passivation layer 121 are formed, the angle F' is larger than 5 degrees and equal to or smaller than 90 degrees (e.g., 5°<F'≤90°), and the angle F is larger than 5 degrees and smaller than 90 degrees (e.g., 5°<F<90°).

The semiconductor device 200 in FIG. 16B is formed by the similar processing as FIG. 16A, but with the curing of the dielectric layer 131 performed before the openings in the passivation layer 121 are formed. In particular, after the dielectric layer 131 (e.g., a photosensitive polymer layer) is exposed and developed, the dielectric layer 131 is cured, e.g., by a thermal process. Next, the cured patterned dielectric layer 131 is used as an etching mask in a subsequent etching process, which subsequent etching process etches through the passivation layer 121 to form openings that expose the conductive pads 119. Next, the conductive bumps 125 or 127 are formed, following similar processing as discussed above.

Note that in FIG. 16B, by curing the dielectric layer 131 before the openings in the passivation layer 121 are formed, the angle F' is larger than 5 degrees and smaller than 90 degrees (e.g., 5°<F'<90°), and the angle F is larger than 5 degrees and smaller than 90 degrees (e.g., 5°<F<90°). In some embodiments, the processing sequence of FIG. 16A (e.g., curing the dielectric layer 131 after the openings in the passivation layer 121 are formed) allows for a larger angle F' (e.g., steeper sidewalls of the dielectric layer 131) to be formed than the processing sequences in FIG. 16B (e.g., curing the dielectric layer 131 before the openings in the passivation layer 121 are formed). The larger angle F' may advantageously reduce the stress in the device formed, e.g., at the corner of the dielectric layer 131, and may prevent or reduce cracking or peeling of the materials (e.g., 131) of the semiconductor device.

Embodiments of the present disclosure achieve some advantageous features. For example, the dummy bumps 128 are formed over conductive lines 118 instead of dummy conductive pads. This allows for more flexible design and layout. As another example, the formation of the dielectric layer 131 removes the difficulties associated with forming and removing the seed layer in high aspect-ratio gaps during formation of the conductive bumps (e.g., 125, 127, 128), thereby improving device reliability and product yield. Furthermore, the hybrid layout allows for more flexible placement of the conductive bumps in the design to accommodate different design requirements.

Figure 17:
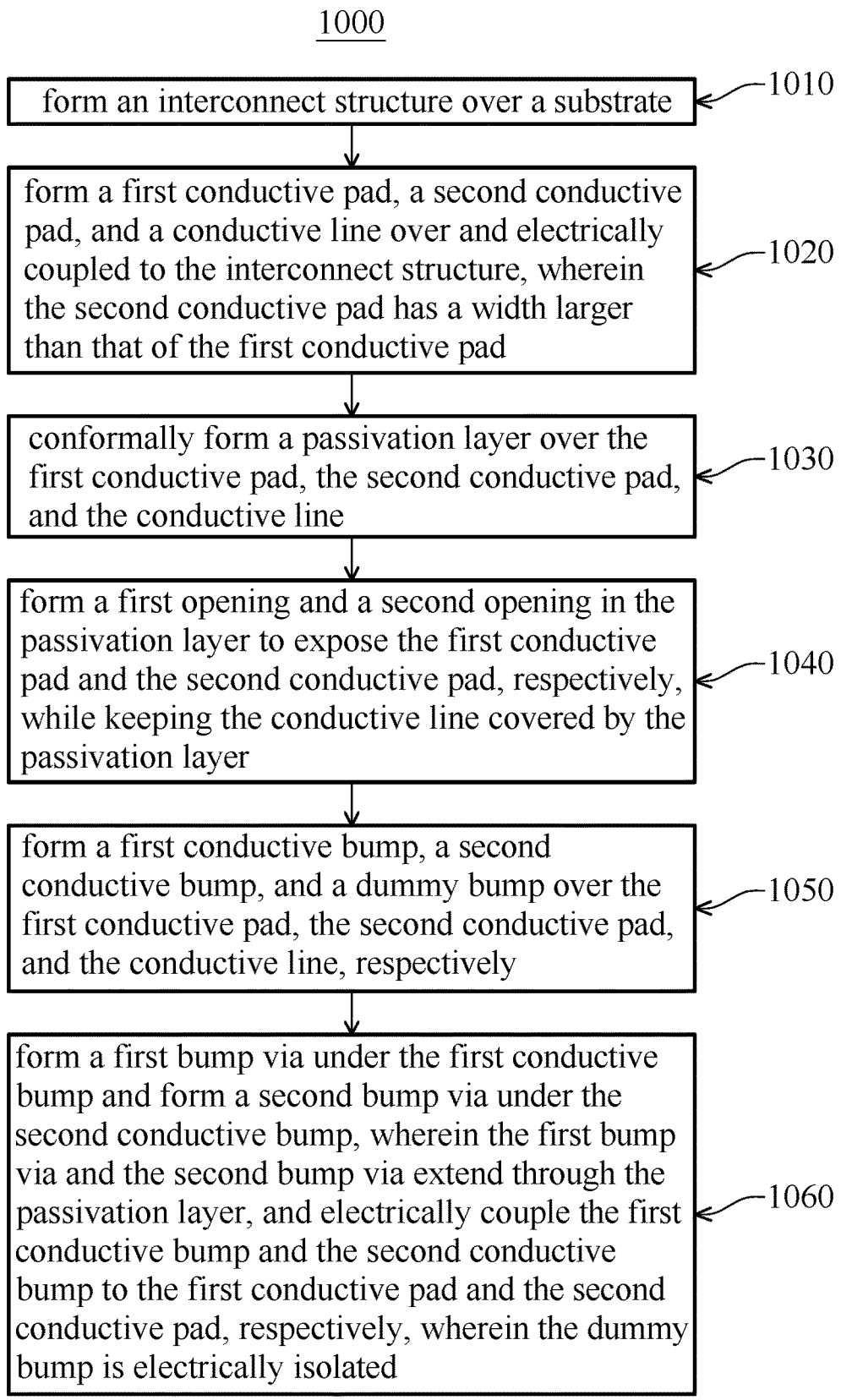
FIG. 17 illustrates a flow chart of a method of forming a semiconductor device, in accordance with some embodiments.

FIG. 17 illustrates a flow chart of a method of fabricating a semiconductor structure, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged, or repeated.

Referring to FIG. 17, at block 1010, an interconnect structure is formed over a substrate. At block 1020, a first conductive pad, a second conductive pad, and a conductive line are formed over and electrically coupled to the interconnect structure, wherein the second conductive pad has a width larger than that of the first conductive pad. At block 1030, a passivation layer is formed conformally over the first conductive pad, the second conductive pad, and the conductive line. At block 1040, a first opening and a second opening are formed in the passivation layer to expose the first conductive pad and the second conductive pad, respectively, while keeping the conductive line covered by the passivation layer. At block 1050, a first conductive bump, a second conductive bump, and a dummy bump are formed over the first conductive pad, the second conductive pad, and the conductive line, respectively. At block 1060, a first bump via is formed under the first conductive bump and a second bump via is formed under the second conductive bump, wherein the first bump via and the second bump via extend through the passivation layer, and electrically couple the first conductive bump and the second conductive bump to the first conductive pad and the second conductive pad, respectively, wherein the dummy bump is electrically isolated.

In accordance with an embodiment of the present disclosure, a semiconductor device includes a substrate; an interconnect structure over the substrate; a first passivation layer over the interconnect structure; a first conductive pad, a second conductive pad, and a conductive line that are disposed over the first passivation layer and electrically coupled to conductive features of the interconnect structure; a conformal second passivation layer over and extending along upper surfaces and sidewalls of the first conductive pad, the second conductive pad, and the conductive line; a first conductive bump and a second conductive bump over the first conductive pad and the second conductive pad, respectively, wherein the first conductive bump and the second conductive bump extend through the conformal second passivation layer and are electrically coupled to the first conductive pad and the second conductive pad, respectively; and a dummy bump over the conductive line, wherein the dummy bump is separated from the conductive line by the conformal second passivation layer. In an embodiment, the dummy bump comprises a same electrically conductive material as the first conductive bump and the second conductive bump, wherein the dummy bump is electrically isolated from the conductive line and the interconnect structure. In an embodiment, the semiconductor device further comprises a dielectric layer between the conformal second passivation layer and the dummy bump, wherein a lower surface of the dummy bump facing the substrate contacts and extends along an upper surface of the dielectric layer distal from the substrate. In an embodiment, the semiconductor device further comprises a first bump via and a second bump via, wherein the first bump via extends through the dielectric layer and the conformal second passivation layer to electrically couple the first conductive bump to the first conductive pad, wherein the second bump via extends through the dielectric layer and the conformal second passivation layer to electrically couple the second conductive bump to the second conductive pad. In an embodiment, a first width of the first conductive bump is smaller than a second width of the second conductive bump. In an embodiment, a third width of the dummy bump is a same as the first width. In an embodiment, the first bump via extends from the upper surface of the dielectric layer to the first conductive pad, wherein a width of the first bump via has a step change. In an embodiment, the second bump via extends from the upper surface of the dielectric layer to the second conductive pad, wherein the dielectric layer is disposed laterally between a sidewall of the second bump via and a sidewall of the conformal second passivation layer facing the second bump via. In an embodiment, the second bump via extends from the upper surface of the dielectric layer to the second conductive pad, wherein a width of the second bump via has a step change. In an embodiment, the second bump via extends from the upper surface of the dielectric layer to the second conductive pad, wherein a width of the second bump via changes continuously as the second bump via extends toward the substrate. In an embodiment, the semiconductor device further comprises a metal-insulator-metal (MIM) capacitor embedded in the first passivation layer. In an embodiment, in a top view, the first conductive bump is smaller than the second conductive bump, wherein the semiconductor device further comprises a third conductive bump having a same size as the second conductive bump, wherein the first conductive bump is disposed between the second conductive bump and the third conductive bump.

In accordance with an embodiment of the present disclosure, a semiconductor device includes an interconnect structure over a substrate; a first conductive pad, a second conductive pad, and a conductive line over and electrically coupled to the interconnect structure; a passivation layer over the first conductive pad, the second conductive pad, and the conductive line, wherein the passivation layer is conformal and extends along exterior surfaces of the first conductive pad, the second conductive pad, and the conductive line; a first conductive bump, a second conductive bump, and a dummy bump over the first conductive pad, the second conductive pad, and the conductive line, respectively, wherein a first width of the first conductive bump is smaller than a second width of the second conductive bump; and a first bump via and a second bump via under the first conductive bump and the second conductive bump, respectively, wherein the first bump via extends through the passivation layer and contacts the first conductive pad, wherein the second bump via extends through the passivation layer and contacts the second conductive pad, wherein the dummy bump is separated from the conductive line by the passivation layer and is electrically isolated from the conductive line. In an embodiment, the semiconductor device further comprises a dielectric layer over the passivation layer, wherein the first bump via extends into the dielectric layer and contacts a first upper surface of the first conductive pad, and wherein the second bump via extends into the dielectric layer and contacts a second upper surface of the second conductive pad. In an embodiment, the first bump via has a first sidewall contacting the dielectric layer and has a second sidewall contacting the passivation layer, wherein there is a first lateral offset between the first sidewall and the second sidewall. In an embodiment, the second bump via has a third sidewall contacting the dielectric layer and has a fourth sidewall contacting the passivation layer, wherein there is a second lateral offset between the third sidewall and the fourth sidewall. In an embodiment, sidewalls of the second bump via contact and extend along the dielectric layer and the passivation layer, wherein a distance between the sidewalls of the second bump via changes continuously as the second bump via extends toward the substrate. In an embodiment, the second bump via is spaced apart from the passivation layer.

In accordance with an embodiment of the present disclosure, a method of forming a semiconductor device includes forming an interconnect structure over a substrate; forming a first conductive pad, a second conductive pad, and a conductive line over and electrically coupled to the interconnect structure, wherein the second conductive pad has a width larger than that of the first conductive pad; conformally forming a passivation layer over the first conductive pad, the second conductive pad, and the conductive line; forming a first opening and a second opening in the passivation layer to expose the first conductive pad and the second conductive pad, respectively, while keeping the conductive line covered by the passivation layer; forming a first conductive bump, a second conductive bump, and a dummy bump over the first conductive pad, the second conductive pad, and the conductive line, respectively; and forming a first bump via under the first conductive bump and forming a second bump via under the second conductive bump, wherein the first bump via and the second bump via extend through the passivation layer, and electrically couple the first conductive bump and the second conductive bump to the first conductive pad and the second conductive pad, respectively, wherein the dummy bump is electrically isolated. In an embodiment, the method further comprises after forming the first opening and the second opening and before forming the first conductive bump, the second conductive bump, and the dummy bump: forming a dielectric layer over the passivation layer, wherein the dielectric layer fills the first opening and the second opening; and forming a third opening and a fourth opening in the dielectric layer over locations of the first opening and the second opening to expose the first conductive pad and the second conductive pad, respectively, wherein the first bump via and the second bump via are formed in the third opening and the fourth opening, respectively, wherein after the dummy bump is formed, the dummy bump is separated from the conductive line by the passivation layer and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
electrical components over the substrate, wherein the electrical components comprise a transistor;
an interconnect structure over the substrate, wherein the electrical components are interconnected by the interconnect structure and form a functional circuit of a functional die;
a first passivation layer over the interconnect structure;
a metal-insulator-metal (MIM) capacitor embedded in the first passivation layer;
a first conductive pad, a second conductive pad, and a conductive line that are disposed over the first passivation layer and electrically coupled to respective conductive features of the interconnect structure;
a first via under the second conductive pad, wherein the first via extends into the first passivation layer and electrically couples the second conductive pad to the MIM capacitor, wherein the first via extends through an upper metal layer of the MIM capacitor without contacting the upper metal layer, wherein the first via contacts an upper surface of a lower metal layer of the MIM capacitor;
a conformal second passivation layer over and extending along upper surfaces and sidewalls of the first conductive pad, the second conductive pad, and the conductive line;
a first conductive bump and a second conductive bump over and electrically coupled to the first conductive pad and the second conductive pad, respectively;
a first bump via and a second bump via under the first conductive bump and the second conductive bump, respectively, wherein the first bump via extends through the conformal second passivation layer to electrically couple the first conductive bump to the first conductive pad, wherein the second bump via extends through the conformal second passivation layer to electrically couple the second conductive bump to the second conductive pad, wherein a first sidewall profile of the first bump via is different from a second sidewall profile of the second bump via; and
a dummy bump over the conductive line, wherein the dummy bump is separated from the conductive line by the conformal second passivation layer, wherein the first conductive bump, the second conductive bump, and the dummy bump are external connectors of the functional die.

2. The semiconductor device of claim 1, wherein a first width of the first conductive bump, measured between sidewalls of the first conductive bump, is smaller than a second width of the second conductive bump measured between sidewalls of the second conductive bump.

3. The semiconductor device of claim 2, further comprising a dielectric layer over the conformal second passivation layer, wherein the first conductive bump, the second conductive bump, and the dummy bump are disposed over an upper surface of the dielectric layer distal from the substrate, wherein the first bump via and the second bump via are disposed below the upper surface of the dielectric layer, wherein a lowermost surface of the dummy bump facing the substrate contacts and extends along the upper surface of the dielectric layer.

4. The semiconductor device of claim 3, wherein an upper portion of the first bump via contacts and extends along the dielectric layer, and a lower portion of the first bump via contacts and extends along the conformal second passivation layer, wherein at an interface between the upper portion and the lower portion of the first bump via, there is a step change between a width of the upper portion of the first bump via and a width of the lower portion of the first bump via.

5. The semiconductor device of claim 4, wherein the width of the upper portion of the first bump via is larger than the width of the lower portion of the first bump via.

6. The semiconductor device of claim 4, wherein a width of the second bump via changes continuously as the second bump via extends from the upper surface of the dielectric layer toward the substrate.

7. The semiconductor device of claim 6, wherein sidewalls of the second bump via extend along slanted straight lines.

8. The semiconductor device of claim 1, wherein the dummy bump, the first conductive bump, and the second conductive bump comprise a same electrically conductive material, wherein the dummy bump is electrically isolated.

9. The semiconductor device of claim 3, wherein there is no electrically conductive feature in the dielectric layer between the dummy bump and the conductive line.

10. A semiconductor device comprising:
a substrate;
electrical components over the substrate, wherein the electrical components comprise a transistor;
an interconnect structure over the substrate, wherein the electrical components are interconnected by the interconnect structure and form a functional circuit of a functional die;
a first passivation layer over the interconnect structure;
a first conductive pad, a second conductive pad, and a conductive line that are over the first passivation layer and electrically coupled to the interconnect structure;
a first via and a second via that are disposed under, and in contact with, a lower surface of the second conductive pad, wherein the lower surface of the second conductive pad extends along the first passivation layer, wherein the first via and the second via extend from the lower surface of the second conductive pad toward the first passivation layer, wherein the first via extends closer to the substrate than the second via;
a second passivation layer over the first conductive pad, the second conductive pad, and the conductive line, wherein the second passivation layer is conformal and extends along exterior surfaces of the first conductive pad, the second conductive pad, and the conductive line;
a first conductive bump, a second conductive bump, and a dummy bump over the first conductive pad, the second conductive pad, and the conductive line, respectively, wherein the first conductive bump is narrower than the second conductive bump; and
a first bump via and a second bump via under the first conductive bump and the second conductive bump, respectively, wherein the first bump via extends through the second passivation layer and contacts the first conductive pad, wherein the second bump via extends through the second passivation layer and contacts the second conductive pad, wherein the first bump via is narrower than the second bump via, wherein the dummy bump is separated from the conductive line by the second passivation layer and is electrically isolated, wherein the first conductive bump, the second conductive bump, and the dummy bump are external connectors of the functional die.

11. The semiconductor device of claim 10, further comprising a dielectric layer over the second passivation layer, wherein the first bump via extends into the dielectric layer and contacts a first upper surface of the first conductive pad, wherein the second bump via extends into the dielectric layer and contacts a second upper surface of the second conductive pad, wherein a lowermost surface of the dummy bump facing the substrate contacts and extends along an upper surface of the dielectric layer distal from the substrate, wherein there is no electrically conductive feature in the dielectric layer between the dummy bump and the conductive line.

12. The semiconductor device of claim 11, wherein an upper portion of the first bump via has a first sidewall contacting the dielectric layer, and a lower portion of the first bump via has a second sidewall contacting the second passivation layer, wherein there is a lateral offset between the first sidewall and the second sidewall.

13. The semiconductor device of claim 12, wherein an upper portion of the second bump via has a third sidewall contacting the dielectric layer, and a lower portion of the second bump via has a fourth sidewall contacting the second passivation layer, wherein there is no lateral offset between the third sidewall and the fourth sidewall.

14. The semiconductor device of claim 11, wherein a distance between opposing sidewalls of the first bump via has a step change at an interface between the dielectric layer and the second passivation layer, wherein a distance between opposing sidewalls of the second bump via changes continuously as the second bump via extends toward the substrate.

15. The semiconductor device of claim 14, wherein a first upper surface of a first portion of the second passivation layer at the first upper surface of the first conductive pad is exposed by the dielectric layer, wherein a second upper surface of a second portion of the second passivation layer at the second upper surface of the second conductive pad is covered by the dielectric layer.

16. The semiconductor device of claim 10, further comprising a metal-insulator-metal (MIM) capacitor embedded in the first passivation layer, wherein the first via extends through the first passivation layer and is electrically coupled to a conductive feature of the interconnect structure, wherein the second via is electrically coupled to an electrode of the MIM capacitor.

17. The semiconductor device of claim 10, wherein the first conductive bump, the second conductive bump, and the dummy bump comprise a same conductive material.

18. The semiconductor device of claim 14, wherein the opposing sidewalls of the second bump via are slanted sidewalls.

19. A semiconductor device comprising:
a substrate;
electrical components over the substrate, wherein the electrical components comprise a transistor;
an interconnect structure over the substrate, wherein the electrical components are interconnected by the interconnect structure and form a functional circuit of a functional die;
a first passivation layer over the interconnect structure;
a metal-insulator-metal (MIM) capacitor embedded in the first passivation layer;
a first conductive pad, a second conductive pad, and a conductive line over the first passivation layer and electrically coupled to the interconnect structure, wherein the second conductive pad has a width larger than that of the first conductive pad;
a first via and a second via that are disposed under and connected with the second conductive pad, wherein the first via extends closer to the substrate than the second via, wherein the first via extends through the first passivation layer and is electrically coupled to a conductive feature of the interconnect structure, wherein the second via is electrically coupled to an electrode of the MIM capacitor;
a conformal second passivation layer extending along exterior surfaces of the first conductive pad, the second conductive pad, and the conductive line;
a dielectric layer over the conformal second passivation layer;
a first conductive bump, a second conductive bump, and a dummy bump over the dielectric layer;
a first bump via under the first conductive bump, wherein the first bump via extends through the dielectric layer and the conformal second passivation layer, and electrically couples the first conductive bump to the first conductive pad, wherein there is a lateral offset between a first sidewall of an upper portion of the first bump via and a respective second sidewall of a lower portion of the first bump via; and
a second bump via under the second conductive bump, wherein the second bump via extends through the dielectric layer and the conformal second passivation layer, and electrically couples the second conductive bump to the second conductive pad, wherein a first sidewall of an upper portion of the second bump via and a respective second sidewall of a lower portion of the second bump via extend along a same line, wherein the dummy bump is separated from the conductive line by the conformal second passivation layer and the dielectric layer, and is electrically isolated, wherein the first conductive bump, the second conductive bump, and the dummy bump are external connectors of the functional die.

20. The semiconductor device of claim 19, wherein the upper portion of the first bump via and the upper portion of the second bump via extend along a first sidewall of the dielectric layer and a second sidewall of the dielectric layer, respectively, wherein the lower portion of the first bump via and the lower portion of the second bump via extend along a first sidewall of the conformal second passivation layer and a second sidewall of the conformal second passivation layer, respectively.

* * * * *